(12) United States Patent
Komatsu

(10) Patent No.: US 9,761,638 B2
(45) Date of Patent: Sep. 12, 2017

(54) ORGANIC EL DISPLAY PANEL, DISPLAY DEVICE USING SAME, AND METHOD FOR PRODUCING ORGANIC EL DISPLAY PANEL

(71) Applicant: JOLED INC., Tokyo (JP)

(72) Inventor: Takahiro Komatsu, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/035,335

(22) PCT Filed: Nov. 13, 2014

(86) PCT No.: PCT/JP2014/005709
§ 371 (c)(1),
(2) Date: May 9, 2016

(87) PCT Pub. No.: WO2015/072143
PCT Pub. Date: May 21, 2015

(65) Prior Publication Data
US 2016/0293676 A1    Oct. 6, 2016

(30) Foreign Application Priority Data

Nov. 15, 2013 (JP) ................................ 2013-237068

(51) Int. Cl.
*H01L 29/08* (2006.01)
*H01L 27/32* (2006.01)
(Continued)

(52) U.S. Cl.
CPC ............ *H01L 27/3213* (2013.01); *G02B 5/20* (2013.01); *H01L 27/322* (2013.01);
(Continued)

(58) Field of Classification Search
CPC ............ H01L 27/3213; H01L 27/3209; H01L 27/3211; H01L 27/322; H01L 51/0003;
(Continued)

(56) References Cited

U.S. PATENT DOCUMENTS 5,443,922 A    8/1995    Nishizaki et al.
8,059,070 B2   11/2011   Odawara et al.
(Continued)

FOREIGN PATENT DOCUMENTS

JP    05-163488    6/1993
JP    09-279394    10/1997
(Continued)

OTHER PUBLICATIONS

English Machine Translation Japanese Patent Application JP 2013073759_Description.*
(Continued)

*Primary Examiner* — Dzung Tran
(74) *Attorney, Agent, or Firm* — Greenblum & Bernstein, P.L.C.

(57) ABSTRACT

An organic EL display panel includes: a first pixel electrode and a red organic light-emitting layer sequentially disposed in red subpixel region; a second pixel electrode and a green organic light-emitting layer sequentially disposed in green subpixel region; a third pixel electrode and a first blue organic light-emitting layer sequentially disposed in blue subpixel region; a charge generation layer disposed above the red, green, and first blue light-emitting layers; a second blue organic light-emitting layer disposed on the charge generation layer in the entire subpixel regions; a counter electrode disposed above the second blue light-emitting layer in the entire subpixels regions; a first light conversion layer disposed above the second blue light-emitting layer in the red subpixel region, and converts blue light to red light; and a second light conversion layer disposed above the second blue light-emitting layer in the green subpixel region, and converts blue light to green light.

16 Claims, 15 Drawing Sheets

(51) Int. Cl.
*G02B 5/20* (2006.01)
*H05B 33/14* (2006.01)
*H01L 51/50* (2006.01)
*H01L 51/52* (2006.01)
*H01L 51/00* (2006.01)
*H01L 51/56* (2006.01)

(52) U.S. Cl.
CPC ...... *H01L 27/3209* (2013.01); *H01L 27/3211* (2013.01); *H01L 51/0003* (2013.01); *H01L 51/0005* (2013.01); *H01L 51/0008* (2013.01); *H01L 51/504* (2013.01); *H01L 51/5036* (2013.01); *H01L 51/5281* (2013.01); *H01L 51/56* (2013.01); *H05B 33/145* (2013.01); *H01L 27/3244* (2013.01); *H01L 51/5012* (2013.01); *H01L 2227/323* (2013.01)

(58) Field of Classification Search
CPC ............. H01L 51/0005; H01L 51/0008; H01L 51/5036; H01L 51/504; H01L 51/5281; H01L 51/56; H01L 2227/323; H01L 51/5012; H05B 33/145
USPC .......................................................... 257/40
See application file for complete search history.

(56) References Cited

U.S. PATENT DOCUMENTS

| | | | |
|---|---|---|---|
| 2002/0036463 A1* | 3/2002 | Yoneda | H01J 1/74 313/506 |
| 2005/0012105 A1* | 1/2005 | Yamazaki | H01L 27/322 257/79 |
| 2005/0116619 A1* | 6/2005 | Kuma | H01L 27/322 313/503 |
| 2006/0231830 A1 | 10/2006 | Matsuda | |
| 2008/0124647 A1* | 5/2008 | Matsuda | B41M 5/38214 430/270.1 |
| 2008/0157657 A1* | 7/2008 | Matsunami | H01L 51/006 313/504 |
| 2008/0224968 A1 | 9/2008 | Kashiwabara | |
| 2009/0091256 A1* | 4/2009 | Ito | G02B 5/201 313/504 |
| 2011/0101398 A1 | 5/2011 | Uchida | |
| 2012/0037895 A1 | 2/2012 | Endo et al. | |

FOREIGN PATENT DOCUMENTS

| | | |
|---|---|---|
| JP | 2006-269226 | 10/2006 |
| JP | 2006-324233 | 11/2006 |
| JP | 2008-225179 | 9/2008 |
| JP | 2011-119212 | 6/2011 |
| JP | 2013-073759 | 4/2013 |
| JP | 2013-073842 | 4/2013 |
| WO | 2010/110277 | 9/2010 |

OTHER PUBLICATIONS

International Search Report (ISR) from International Searching Authority (Japan Patent Office) in International Pat. Appl. No. PCT/JP2014/005709, dated Feb. 24, 2015.

Chiba et al., "Ultra-high efficiency by multiple emission from stacked organic light-emitting devices", Organic Electronics 12 (2011), pp. 710-715.

Zhang et al., "High efficiency tandem organic light-emitting devices with Al/WO$_3$/Au interconnecting layer", Applied Physics Letters 91, 123504 (2007), pp. 1-3.

* cited by examiner

Wet process

Dry process

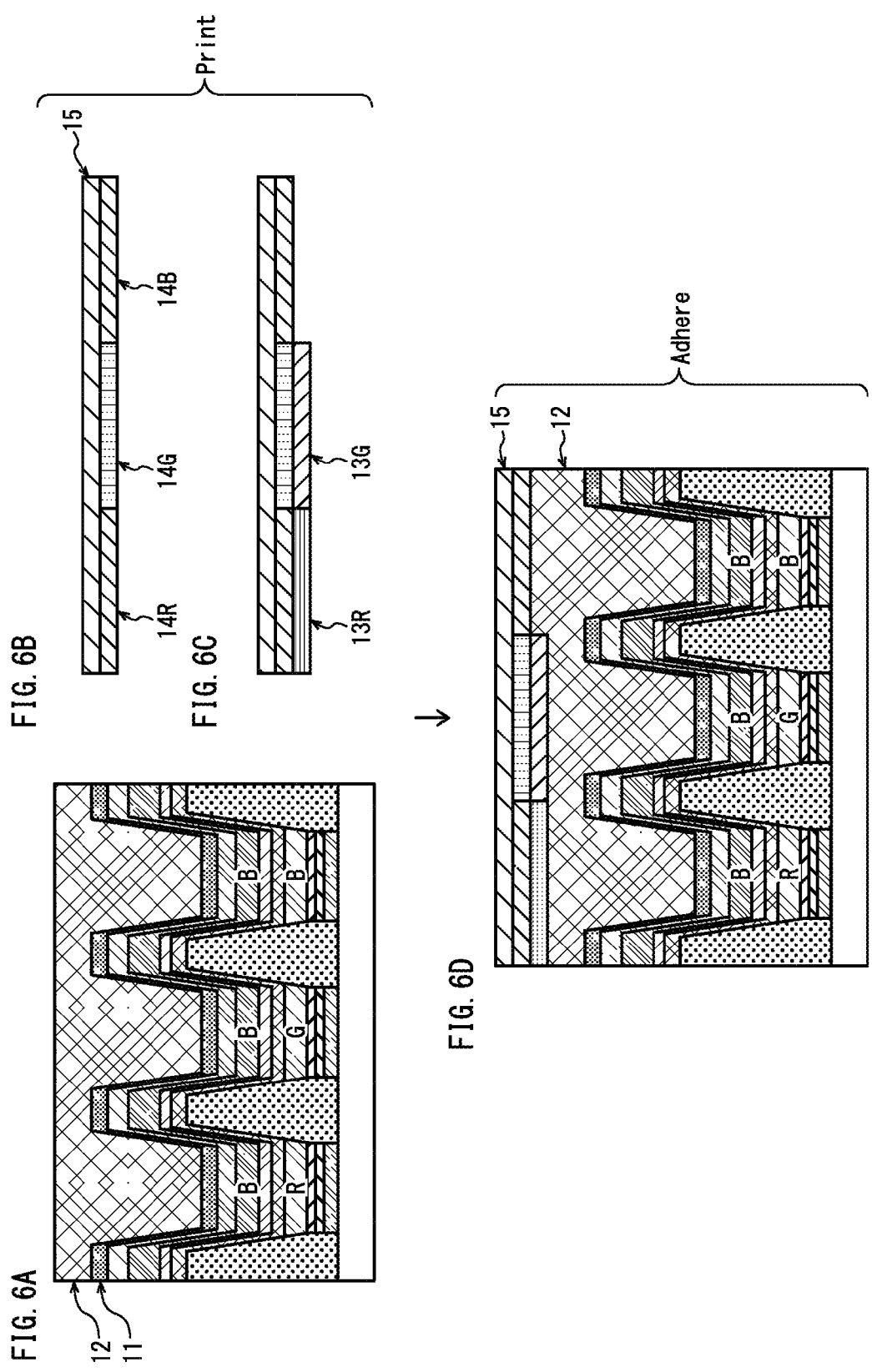

Dry process

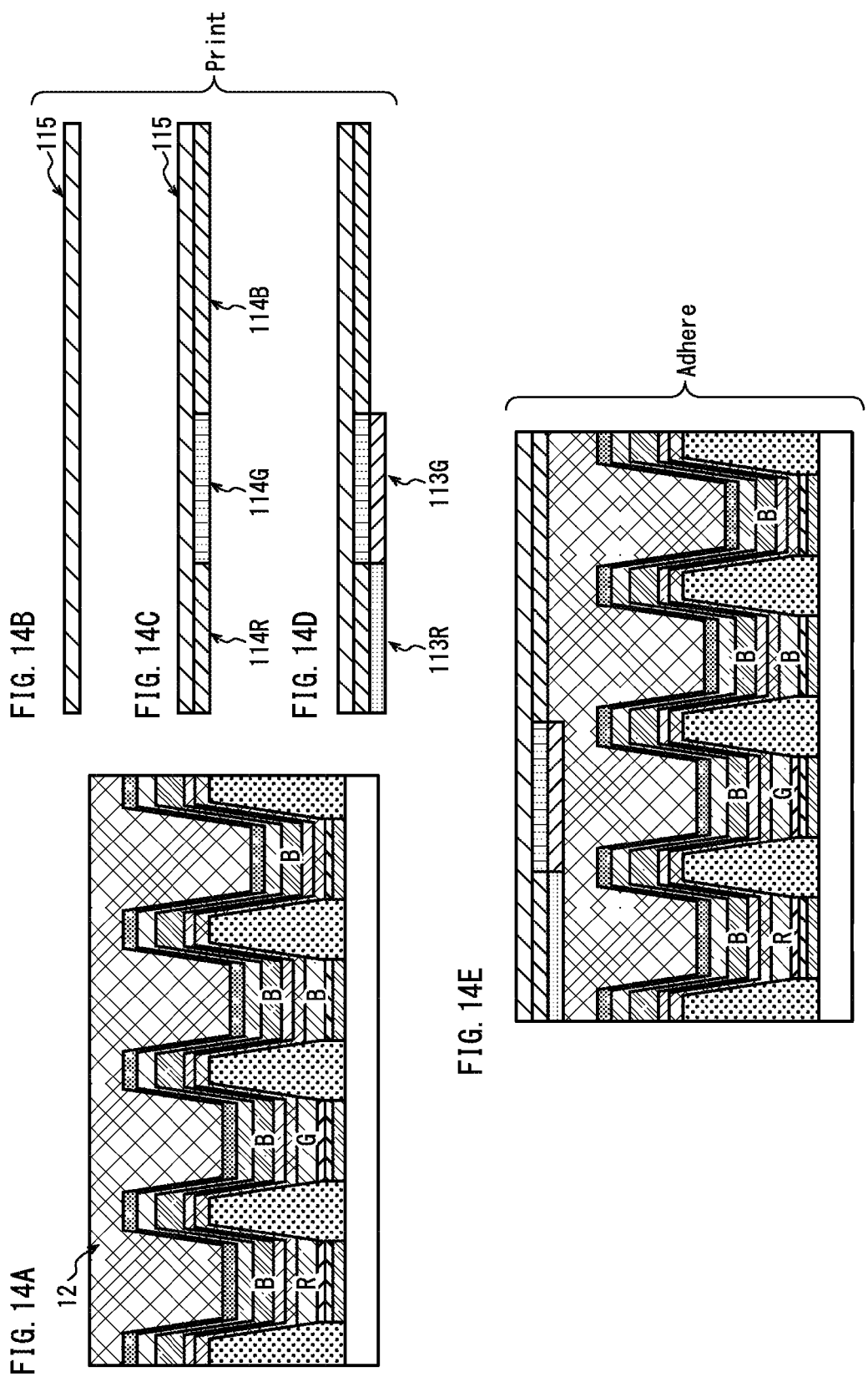

ORGANIC EL DISPLAY PANEL, DISPLAY DEVICE USING SAME, AND METHOD FOR PRODUCING ORGANIC EL DISPLAY PANEL

TECHNICAL FIELD

The present disclosure relates to an organic electro luminescence (EL) display panel that rely on electroluminescence phenomenon of organic materials, a display device using the same, and a manufacturing method of the organic EL display panel.

BACKGROUND ART

There have been recently put into practical use, as display panels for display devices such as digital televisions, organic EL panels that include organic light-emitting elements arranged on a substrate in a matrix and rely on electroluminescence phenomenon of organic materials.

A commonly known structure of such organic EL display panels is that drive circuits (for example, including thin film transistor (TFT) elements) are disposed on a substrate, an insulating layer is disposed on the drive circuits, and organic light-emitting elements are further arranged on the insulating layer. The organic light-emitting elements each include, as the basic structure, an anode that is disposed on the insulating layer, a laminate that is disposed on the anode and is composed of a light-emitting layer made of an organic light-emitting material and a functional layer, and a transparent conductive cathode that is disposed on the laminate. Such organic light-emitting elements are current-driven light-emitting elements. When the organic light-emitting elements are driven, voltage is applied between each anode and the cathode, and holes and electrons injected to the light-emitting layer recombine with each other, and thus the organic light-emitting elements emit light.

According to the organic EL display panels, the organic light-emitting elements each form any one of respective subpixels of red (R), green (G), and blue (B) colors, and each adjacent red, green, and blue subpixels constitute a single pixel. It is important to improve the luminous efficiency and the life property of the respective organic EL elements of the R, G, and B colors, from the standpoint of reducing the power consumption, increasing the operating life of the organic EL display panels, and the like. The blue organic EL elements tend to have the shortest operating life among the respective organic EL elements of the R, G, and B colors, and accordingly there has been a problem that the operating life of the blue organic EL elements needs to be prolonged in order to prolong the operating life of display devices.

In view of the problem, Patent Literature 1 has proposed a technology of realizing luminous efficiency improvement, operating life prolonging, cost reduction in the manufacturing facilities, and productivity improvement in an organic EL display panel by using the nozzle printing method and the vacuum deposition method to adopt the multiphoton emission structure in which only blue light-emitting elements are stacked in two layers (see for example paragraph 0065). Specifically, red light-emitting layers, green light-emitting layers, and first blue light-emitting layers are formed by the wet deposition method, and then a charge generation layer is formed only in each blue subpixel region by the vacuum deposition method. Further, a second blue light-emitting layer is formed by the vacuum deposition method so as to cover the red light-emitting layers, the green light-emitting layers, and the charge generation layers. The second blue light-emitting layer exhibits an electron transport function on the red light-emitting layers and the green light-emitting layers, and functions as a blue light-emitting layer on the charge generation layers. Patent Literature 1 discloses that this structure realizes operating life prolonging of the blue organic light-emitting elements, cost reduction in the manufacturing facilities, and productivity improvement.

CITATION LIST

Patent Literature

Japanese Patent Application Publication No. 2013-73759

SUMMARY OF INVENTION

Technical Problem

However, there has been a demand for further improvement in luminous efficiency and productivity in organic EL display panels in order to realize luminance increase, power consumption lowering, and cost reduction of display devices.

In view of the above problem, the present disclosure aims to provide an organic EL display panel having a further improved luminous efficiency and productivity in an organic EL display panel having the multiphoton emission structure.

Solution to Problem

One aspect of the present disclosure provides an organic EL display panel that includes pixels each of which is composed of a red subpixel, a green subpixel, and a blue subpixel, the organic EL display panel comprising: a substrate; a barrier rib that is disposed on the substrate, and partitions between a red subpixel region, a green subpixel region, and a blue subpixel region of the respective red, green, and blue subpixels; a first pixel electrode and a red organic light-emitting layer that are disposed above the substrate sequentially from a side of the substrate in the red subpixel region; a second pixel electrode and a green organic light-emitting layer that are disposed above the substrate sequentially from the side of the substrate in the green subpixel region; a third pixel electrode and a first blue organic light-emitting layer that are disposed above the substrate sequentially from the side of the substrate in the blue subpixel region; a charge generation layer that is disposed above the red, green, and first blue organic light-emitting layers; a second blue organic light-emitting layer that is disposed on the charge generation layer in the red, green, and blue subpixel regions; a counter electrode of the first, second, and third pixel electrodes that is disposed above the second blue organic light-emitting layer in the red, green, and blue subpixels regions; a first light conversion layer that is disposed above the second blue organic light-emitting layer in the red subpixel region, and converts blue light to red light; and a second light conversion layer that is disposed above the second blue organic light-emitting layer in the green subpixel region, and converts blue light to green light.

Advantageous Effects of Invention

According to the organic EL display panel relating to the above aspect having the structure described above, blue light, which is emitted from the blue organic light-emitting layer in each red subpixel region, is converted to red light, and blue light, which is emitted from the blue organic light-emitting layer in each green subpixel region, is converted to green light, and then the converted light is emitted as light which is output from the organic EL display panel. Also, the loss of deposition materials, which has conventionally been caused by the use of the shadow mask method, is prevented, and an alignment process of a precise mask at a high precision is eliminated. As a result, it is possible to improve the luminous efficiency and the productivity in the organic EL display panel having the multiphoton emission structure.

BRIEF DESCRIPTION OF DRAWINGS

FIG. 6A to FIG. 6D are views for explaining the manufacturing method of the organic EL display panel 100 relating to Embodiment 1.

FIG. 14A to FIG. 14E are views for explaining the manufacturing method of the organic EL display panel 200 relating to Embodiment 2.

DESCRIPTION OF EMBODIMENTS

Figure 1:
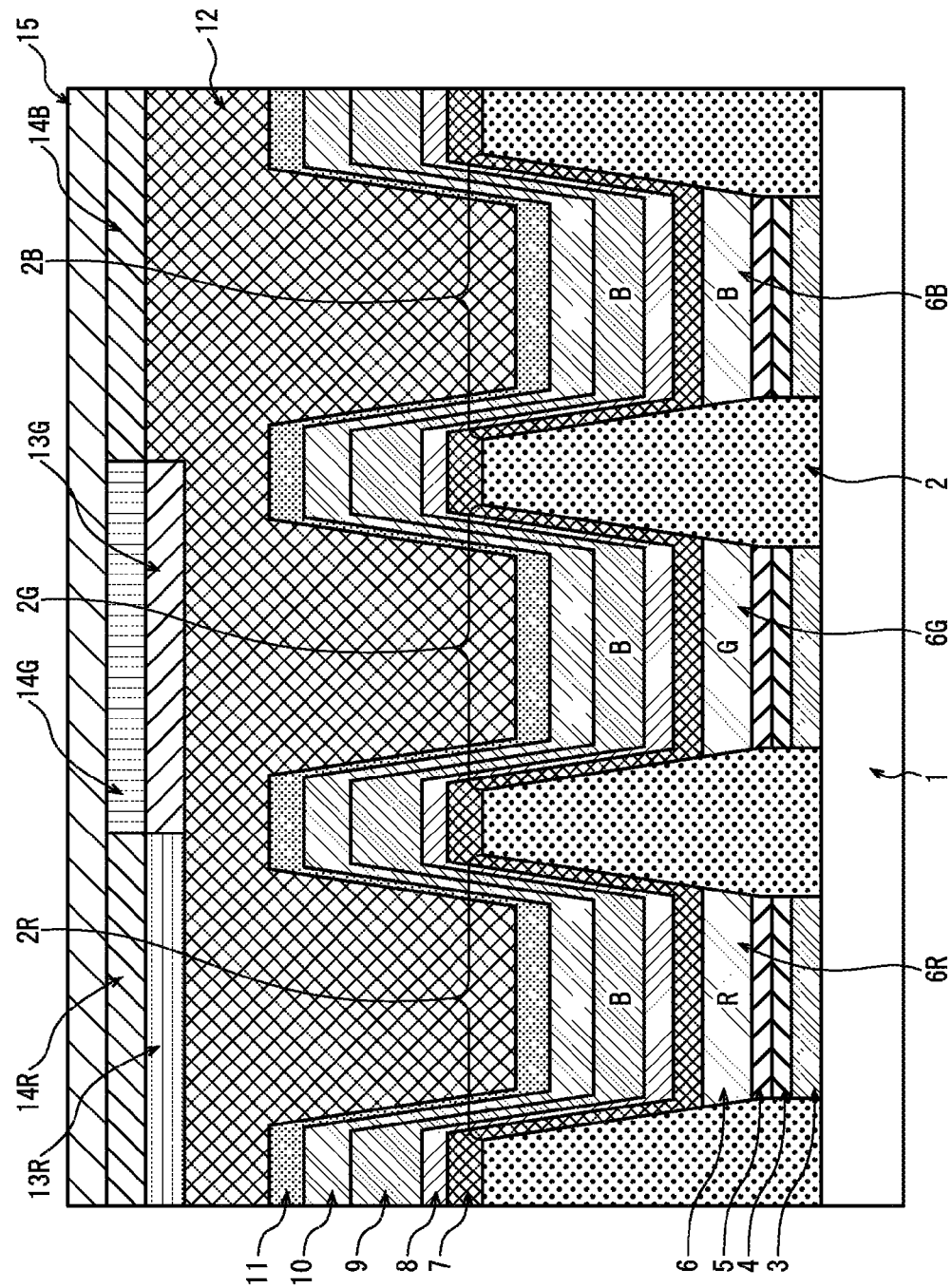
FIG. 1 is a cross-sectional view schematically showing the pixel structure in an organic EL display panel 100 relating to Embodiment 1.

Process by which Embodiments of the Present Disclosure were Achieved

According to the organic EL display panel disclosed in Patent Literature 1, as described above, it is possible to increase the current efficiency, which indicates the magnitude relative to the current, by adopting the multiphoton emission structure in which light-emitting layers are stacked in two layers. This seems to be because of the following reason. The first blue light-emitting layers, which are made of a fluorescent light-emitting material, exhibit a lower luminous efficiency than the red and green light-emitting layers, which are made of a phosphor light-emitting material. Compared with this, a blue light-emitting layer, which is formed by the vacuum process, is made of a fluorescent light-emitting material, but exhibits a higher luminous efficiency than the first blue light-emitting layers, which are formed by the wet process. By using this blue light-emitting layer as the second blue light-emitting layer, it is possible to compensate the low luminance of the first blue light-emitting layers, which exhibit a lower luminous efficiency than the red and green light-emitting layers. Generally, the driving life of an organic EL display panel prolongs as the current load in driving reduces. According to the organic EL display panel disclosed in Patent Literature 1, it seems that addition of the second blue light-emitting layer improves the current efficiency, and thereby to prolong the operating life of the blue light emitting elements owing to the decrease of the current necessary for achieving a desired luminance.

The organic EL display panel disclosed in Patent Literature 1 includes the second blue light-emitting layer that is formed by the vacuum deposition method on the red and green light-emitting layers and above the first blue light-emitting layers. However, only part of the second blue light-emitting layer, which is formed above the first blue light-emitting layer, contributes to light emission from the organic EL display panel.

As described above, further improvement in luminous efficiency in organic EL display panels has been demanded in order to further improve the luminance and further reduce the power consumption of display devices. To meet this demand, the inventor considered that further luminance improvement as the entire organic EL display panel is realized by extracting and outputting light from parts of the second blue light-emitting layer on the red and green light-emitting layers as well as light from the part of the second blue light-emitting layer above the first blue light-emitting layers and thereby improving the luminance in red and green subpixel regions as well as in blue subpixel regions.

Also, a problem in the productive efficiency of organic EL display panels occurs due to the structure disclosed in Patent Literature 1 in which a charge generation layers is formed only in each blue subpixel region by the vacuum deposition method. Specifically, in order to form the charge generation layer only in each blue subpixel region by the vacuum deposition method, patterning is necessary with use of a precise mask having apertures aligned only with the blue subpixel region by the shadow mask method. This causes a great loss of deposition materials due to adhesion of the deposition materials to the entire mask including the apertures, and results in cost increase. Further, the productive efficiency is reduced due to alignment of the apertures of the precise mask with parts of the bank for the blue subpixels at a high precision. In order to prevent the cost increase and the productive efficiency reduction and thereby to realize a further cost reduction of organic EL display panels, it seems to be effective to use the vacuum deposition method for deposition over the entire pixel regions without using the shadow mask method and thereby to effectively utilize the materials, in terms of the material cost and the productive efficiency.

In view of this, the inventor earnestly considered the device structure of an organic EL display panel having the multiphoton emission structure that can increase the luminance in red and green subpixel regions as well as blue subpixel regions and can be manufactured by the vacuum deposition method in which deposition is performed over the entire pixel regions without using the shadow mask method. As a result, the inventor conceived of the organic EL display panel described in embodiments of the present disclosure.

Outline of Embodiments of the Present Disclosure

One aspect of the present disclosure provides an organic EL display panel that includes pixels each of which is composed of a red subpixel, a green subpixel, and a blue subpixel, the organic EL display panel comprising: a substrate; a barrier rib that is disposed on the substrate, and partitions between a red subpixel region, a green subpixel region, and a blue subpixel region of the respective red, green, and blue subpixels; a first pixel electrode and a red organic light-emitting layer that are disposed above the substrate sequentially from a side of the substrate in the red subpixel region; a second pixel electrode and a green organic light-emitting layer that are disposed above the substrate sequentially from the side of the substrate in the green subpixel region; a third pixel electrode and a first blue organic light-emitting layer that are disposed above the substrate sequentially from the side of the substrate in the blue subpixel region; a charge generation layer that is disposed above the red, green, and first blue organic light-emitting layers; a second blue organic light-emitting layer that is disposed on the charge generation layer in the red, green, and blue subpixel regions; a counter electrode of the first, second, and third pixel electrodes that is disposed above the second blue organic light-emitting layer in the red, green, and blue subpixels regions; a first light conversion layer that is disposed above the second blue organic light-emitting layer in the red subpixel region, and converts blue light to red light; and a second light conversion layer that is disposed above the second blue organic light-emitting layer in the green subpixel region, and converts blue light to green light.

Also, in the one aspect, the red, green, and first blue organic light-emitting layers may have undergone a wet process, and the second blue organic light-emitting layer and the charge generation layer may have undergone a dry process.

Also, in the one aspect, the organic EL display panel may further comprise a first filter that is disposed on the first light conversion layer in the red subpixel region, and blocks blue light; a second filter that is disposed on the second light conversion layer in the green subpixel region, and blocks blue light; and a third filter that is disposed in the blue subpixel region, and at least partially blocks blue light that is emitted from at least one of the first and second blue organic light-emitting layers in the blue subpixel region.

Also, in the one aspect, the organic EL display panel may further comprise a third light conversion layer that is disposed above the counter electrode in the blue subpixel region, and converts blue light that is emitted from at least one of the first and second blue organic light-emitting layers in the blue subpixel region to blue light having a different luminescence spectrum from the emitted blue light.

Also, in the one aspect, the organic EL display panel may further comprise a third filter that is disposed above the counter electrode in the blue subpixel region, and partially blocks blue light that is emitted from at least one of the first and second blue organic light-emitting layers in the blue subpixel region.

Also, in the one aspect, the organic EL display panel may further comprise a third light conversion layer that is disposed above the counter electrode in the blue subpixel region, and converts blue light that is emitted from at least one of the first and second blue organic light-emitting layers in the blue subpixel region to blue light having a different luminescence spectrum from the emitted blue light; and a third filter that is disposed on the third light conversion layer, and partially blocks the blue light that is emitted upwards from the third light conversion layer.

Also, in the one aspect, the organic EL display panel may further comprise: a first filter that is disposed above the second blue organic light-emitting layer in the red subpixel region, and blocks blue light; a second filter that is disposed above the second blue organic light-emitting layer in the green subpixel region, and blocks blue light; and a third filter that is disposed in the blue subpixel region, and at least partially blocks blue light that is emitted from at least one of the first and second blue organic light-emitting layers in the blue subpixel region Also, in the one aspect, the organic EL display panel may further comprise a first electron transport layer that is disposed between the entire red, green, and first blue organic light-emitting layers and the charge generation layer; and a second electron transport layer that is disposed between the second blue organic light-emitting layer and the counter electrode in the red, green, and blue subpixel regions, wherein the second electron transport layer may have a larger thickness than the first electron transport layer.

Also, in the one aspect, the charge generation layer may supply holes to the second blue organic light-emitting layer, and supply electrons from at least one of respective parts of the red, green, and blue subpixel regions to a corresponding one of the red, green, and first blue organic light-emitting layers in the red, green, and blue subpixel regions, respectively.

Also, in the one aspect, the charge generation layer may be discontinuous above the red, green, and first blue organic light-emitting layers.

Also, in the one aspect, the second blue organic light-emitting layer may be discontinuous in the red, green, and blue subpixel regions.

Another aspect of the present disclosure provides an organic EL display panel that includes pixels each of which is composed of a red subpixel, a green subpixel, and a blue subpixel, the organic EL display panel comprising: a substrate; a barrier rib that is disposed on the substrate, and partitions between a red subpixel region, a green subpixel region, and a blue subpixel region of the respective red, green, and blue subpixels; a first pixel electrode and a red organic light-emitting layer that are disposed above the substrate sequentially from a side of the substrate in the red subpixel region; a second pixel electrode and a green organic light-emitting layer that are disposed above the substrate sequentially from the side of the substrate in the green subpixel region; a third pixel electrode and a first blue organic light-emitting layer that are disposed above the substrate sequentially from the side of the substrate in the blue subpixel region; a charge generation layer that is disposed above the red, green, and first blue organic light-emitting layers; a second blue organic light-emitting layer that is disposed on the charge generation layer in the red, green, and blue subpixel regions; a counter electrode of the first, second, and third pixel electrodes that is disposed above the second blue organic light-emitting layer in the red, green, and blue subpixels regions; a first filter that is disposed above the second blue organic light-emitting layer in the red subpixel region, and blocks blue light; and a second filter that is disposed above the second blue organic light-emitting layer in the green subpixel region, and blocks blue light.

Also, in the other aspect, the organic EL display panel may further comprise a third filter that is disposed above the counter electrode in the blue subpixel region, and partially blocks blue light that is emitted from at least one of the first and second blue organic light-emitting layers in the blue subpixel region.

A further another aspect of the present disclosure provides an organic EL display panel that includes pixels each of which is composed of a red subpixel, a green subpixel, a blue subpixel, and a dark blue subpixel, the organic EL display panel comprising: a substrate; a barrier rib that is disposed on the substrate, and partitions between a red subpixel region, a green subpixel region, a blue subpixel region, and a dark blue subpixel region of the respective red, green, blue, and dark blue subpixels; a first pixel electrode and a red organic light-emitting layer that are disposed above the substrate sequentially from a side of the substrate in the red subpixel region; a second pixel electrode and a green organic light-emitting layer that are disposed above the substrate sequentially from the side of the substrate in the green subpixel region; a third pixel electrode and a first blue organic light-emitting layer that are disposed above the substrate sequentially from the side of the substrate in the blue subpixel region; a fourth pixel electrode that is disposed on the substrate in the dark blue subpixel region; a charge generation layer that is disposed above the red, green, and first blue organic light-emitting layers and the fourth pixel electrode; a second blue organic light-emitting layer that is disposed on the charge generation layer in the red, green, blue, and dark blue subpixel regions; a counter electrode of the first, second, third pixel, and fourth electrodes that is disposed above the second blue organic light-emitting layer in the red, green, blue, and dark blue subpixels regions; a first light conversion layer that is disposed above the second blue organic light-emitting layer in the red subpixel region, and converts blue light to red light; and a second light conversion layer that is disposed above the second blue organic light-emitting layer in the green subpixel region, and converts blue light to green light.

Also, in the further another aspect, the organic EL display panel may further comprise a first filter that is disposed on the first light conversion layer in the red subpixel region, and blocks blue light; and a second filter that is disposed on the second light conversion layer in the green subpixel region, and blocks blue light.

Also, in the further another aspect, the organic EL display panel may further comprise at least one of: a third filter that is disposed above the counter electrode in the blue subpixel region, and partially blocks blue light that is emitted from at least one of the first and second blue organic light-emitting layers in the blue subpixel region; and a fourth filter that is disposed above the counter electrode in the dark blue subpixel region, and partially blocks blue light that is emitted from at least one of the first and second blue organic light-emitting layers in the dark blue subpixel region.

A further another aspect of the present disclosure provides an organic EL display panel that includes pixels each of which is composed of a red subpixel, a green subpixel, a blue subpixel, and a dark blue subpixel, the organic EL display panel comprising: a substrate; a barrier rib that is disposed on the substrate, and partitions between a red subpixel region, a green subpixel region, a blue subpixel region, and a dark blue subpixel region of the respective red, green, blue, and dark blue subpixels; a first pixel electrode and a red organic light-emitting layer that are disposed above the substrate sequentially from a side of the substrate in the red subpixel region; a second pixel electrode and a green organic light-emitting layer that are disposed above the substrate sequentially from the side of the substrate in the green subpixel region; a third pixel electrode and a first blue organic light-emitting layer that are disposed above the substrate sequentially from the side of the substrate in the blue subpixel region; a fourth pixel electrode that is disposed on the substrate in the dark blue subpixel region; a charge generation layer that is disposed above the red, green, and first blue organic light-emitting layers and the fourth pixel electrode; a second blue organic light-emitting layer that is disposed on the charge generation layer in the red, green, blue, and dark blue subpixel regions; a counter electrode of the first, second, third pixel, and fourth electrodes that is disposed above the second blue organic light-emitting layer in the red, green, blue, and dark blue subpixels regions; a first filter that is disposed above the second blue organic light-emitting layer in the red subpixel region, and blocks transmission of blue light that is emitted from the second blue organic light-emitting layer in the red subpixel region; and a second filter that is disposed above the second blue organic light-emitting layer in the green subpixel region, and blocks transmission of blue light that is emitted from the second blue organic light-emitting layer in the red subpixel region.

A still another aspect of the present disclosure provides a manufacturing method of the organic EL display panel, the manufacturing method comprising the steps of: forming each of the first, second, third pixel electrodes, the red, green, and first blue organic light-emitting layers by a wet process; and forming each of the charge generation layer, the second blue organic light-emitting layer, and the counter electrode by a dry process.

Also, in the still another aspect, the wet process may be one or more of a printing method, a spin coating method, an inkjet method, and a photolithography method, and the dry process may be one or more of a vapor deposition method, a sputtering method, and an ion plating method.

The following explains embodiments.

Embodiment 1

In Embodiment 1, explanation is given on an organic EL display panel of the top emission type.

<Whole Structure of Organic EL Display Panel 100>

FIG. 1 is a cross-sectional view schematically showing the pixel structure in the organic EL display panel 100 relating to Embodiment 1. The organic EL display panel 100 (hereinafter, abbreviated as display panel 100) includes pixels that are each composed of red (R), green (G), and blue (B) subpixels and are regularly arranged in a matrix of rows and columns.

As shown in FIG. 1, the display panel 100 has a substrate as the base thereof. Anodes 3 are disposed on the substrate 1 spaced from each other. A barrier rib 2 (hereinafter, referred to as bank 2) is disposed on the substrate 1, and has openings 2R, 2G, and 2B that are provided therein so as to correspond in position to the red, green, and blue subpixels, respectively.

Within each opening 2R, a hole injection layer 4, a hole transport layer 5, a red organic light-emitting layer 6R (hereinafter, abbreviated as organic light-emitting layer 6R) are sequentially disposed. Within each opening 2G, the hole injection layer 4, the hole transport layer 5, a green organic light-emitting layer 6G (hereinafter, abbreviated as organic light-emitting layer 6G) are sequentially disposed. Within each opening 2B, the hole injection layer 4, the hole transport layer 5, a first blue organic light-emitting layer 6B (hereinafter, abbreviated as organic light-emitting layer 6B) are sequentially disposed. The respective hole injection layers 4 disposed within the openings 2R, 2G, and 2B have thicknesses independent from each other, and may have different thicknesses. Similarly, the respective hole transport layers 5 disposed within the openings 2R, 2G, and 2B may have different thicknesses. Further, the hole injection layers 4 may not need to be provided within part or all of the openings 2R, 2G, and 2B. The same applies to the hole transport layers 5.

A first electron transport layer 7, a charge generation layer 8, a second blue organic light-emitting layer 9, a second electron transport layer 10, a cathode 11, and a resin passivation layer 12 are sequentially disposed as solid films over the entire pixels so as to cover the organic light-emitting layers 6R, 6G, and 6B (hereinafter, referred to collectively as organic light-emitting layers 6 when no distinction is made therebetween) and extend over the openings 2R, 2G, and 2B.

Accordingly, the first electron transport layer 7, the charge generation layer 8, the second blue organic light-emitting layer 9, the second electron transport layer 10, and the cathode 11 each indicate the whole region in the red, green, and blue subpixels. In the present embodiment, the first electron transport layer 7, the charge generation layer 8, the second blue organic light-emitting layer 9, the light conversion layers 13, the second electron transport layer 10, and the cathode 11 have the coinciding outer circumferential edge when viewed in plan.

Further, a first light conversion layer 13R is disposed above each opening 2R so as to correspond in position to each red subpixel, and a second light conversion layer 13G is disposed above each opening 2G so as to correspond in position to each green subpixel. Moreover, red color filters 14R, green color filters 14G, and blue color filters 14B are disposed above the openings 2R, 2G, and 2B, respectively, so as to correspond in position to the red, green, and blue subpixels, respectively. A cover glass 15 is disposed so as to cover the red color filters 14R, the green color filters 14G, and the blue color filters 14B.

<Structure of Elements>

The following explains structural elements of the display panel 100.

(Substrate)

The substrate 1 is a back substrate of the display panel 100, and has a surface on which a TFT layer (not shown) including TFTs is disposed to drive the display panel 100 by an active matrix method.

The substrate 1 is for example a glass plate that is made for example of alkali-free glass, soda glass, nonfluorescent glass, phosphate glass, or borate glass, a quartz plate, a plastic plate or a plastic film that is for example made of acrylic resin, styrene resin, polycarbonate resin, epoxy resin, polyethylene resin, polyester resin, polyimide resin, or silicone resin, or a metal plate or a metal foil that is made for example of alumina. The TFT layer includes a wiring unit for feeding external electrical power to the TFTs. In the present embodiment, only the anodes are extracted in the figure for simplification of the explanation.

Since the organic EL display panel 100 relating to the present embodiment is of the top emission type, the substrate 1 does not need to have translucency. Note that the organic EL display panel 100 may be of the bottom emission type by using a translucent material for the substrate 1 and the anodes 3 which are described later.

Also, the organic EL display panel 100 relating to the present embodiment may be driven by a passive matrix method.

(Bank)

The bank 2 defines subpixel regions for the red, green, and blue subpixels and covers the edge of the cathode 11. The bank 2 only needs to be made of an insulating material, and should preferably be resistant to organic solution. Also, the bank 2 sometimes undergoes etching processing, baking processing, and so on, and accordingly should preferably be made of a material highly resistant to such processing. The bank 2 may be made of an organic material such as resin or an inorganic material such as glass. The organic material is acrylic resin, polymide resin, novolac phenolic resin, or the like. The inorganic material is silicon oxide ($SiO_2$), silicon nitride ($Si_3N_4$), or the like. The bank 2 should have a height depending on the structure of a function layer to be filled. For example, the bank 2 should have a height of 0.5 μm to 2 μm, and should preferably have a height of 0.8 μm to 1.2 μm.

The bank 2 is formed for example by a method of applying photosensitive resin onto the substrate 1, and forming patterns corresponding to the subpixels by the photolithography method.

(Anodes)

The anode 3 is formed within each of the openings 2R, 2G, and 2B which correspond one-to-one to the red, green, and blue subpixels. The anodes 3 are electrically connected to the TFTs disposed on the substrate 1. In addition to functioning as a positive terminal of a light-emitting element, the anodes 3 each have a function of reflecting light, which is emitted from the organic light-emitting layers 6, towards the anode 2. The reflecting function may be achieved by the structural material of the anodes 3 or by applying a reflective coating to the surface portion of the anodes 3. The anodes 3 are made for example of aluminum (Al), alloy of aluminum, silver (Ag), alloy of silver, palladium, and copper (APC), alloy of silver, rubidium, and gold (ARA), alloy of molybdenum and chromium (MoCr), alloy of nickel and chromium (NiCr), molybdenum (Mo), or alloy of molybdenum and tungsten (MoW).

The anodes 3 each may be covered with a transparent conductive layer (not shown). The transparent conductive layer functions as a protective layer for preventing natural oxidation of the anode 3 during the manufacturing process. The transparent conductive layer only needs to be made of a conductive material that is sufficiently translucent with respect to light emitted from the organic light-emitting layers 6. The transparent conductive layer is for example made of indium tin oxide (ITO) or indium zinc oxide (IZO) that achieves an excellent conductivity even under the conditions that film is formed at a room temperature.

The anode 3 is formed by a dry process such as the vacuum deposition method, the electron beam deposition method, the sputtering method, the reactive sputtering method, the ion plating method, and the chemical vapor deposition (CVD) method, and should preferably be formed by the sputtering method. Alternatively, the anode 3 may be formed by a wet process such as the printing method, the spin coating method, and the inkjet method.

(Hole Injection Layers)

The hole injection layers 4 have a function of injecting holes into the organic light-emitting layers 6. The hole injection layer 4 is made for example of triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, azatriphenylene derivative, polystyrene derivative, hydrazone derivative, triphenylmethane derivative, or tetraphenylbenzene derivative (all disclosed in Japanese Patent Application Publication No. H5-163488), or oxide of transition metal such as tungsten oxide (WOx), molybdenum oxide (MoOx), and molybdenum tungsten oxide (MoxWyOz). By using made of oxide of transition metal for the hole injection layers 4, it is possible to improve the voltage-current density characteristics, and increases the current density to increase the emission intensity. Note that other metal compounds such as a transition metal nitride may also be applicable.

(Hole Transport Layers)

The hole transport layers 5 have a function of transporting holes, which are injected from the anodes 3, to the organic light-emitting layers 6. The hole transport layers 5 are made for example of triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, polystyrene derivative, hydrazone derivative, triphenylmethane derivative, or tetraphenylbenzene derivative (all disclosed in Japanese Patent Application Publication No. H5-163488). The hole transport layers 5 should preferably be made of porphyrin compound, aromatic tertiary amine compound, or styrylamine compound.

The wet process may be used for forming the hole injection layers 4 and the hole transport layers 5, such as the printing method, the spin coating method, and the inkjet method. Alternatively, the dry process may be used, such as the vacuum deposition method, the electron beam deposition method, the sputtering method, the reactive sputtering method, the ion plating method, and the CVD method. The wet process such as the inkjet method should preferably be used for cost reduction.

(Organic Light-Emitting Layers)

The organic light-emitting layers 6R, 6G, and 6B emit light through recombination of carriers (holes and electrons), and include an organic material emitting light corresponding to the R, G, and B colors, respectively. The organic light-emitting layers 6R, 6G, and 6B, which include the respective organic materials emitting light of the R, G, and B colors, respectively, are formed within the openings 2R, 2G, and 2B, respectively.

The organic light-emitting layers 6 are made for example of fluorescent substance such as oxinoid compound, perylene compound, coumarin compound, azacouramin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of 8-hydroxyquinoline compound, metal complex of 2-bipyridine compound, complex of Schiff base and group III metal, oxine metal complex, and rare earth complex (all disclosed in Japanese Patent Application Publication No. H5-163488).

The organic light-emitting layers 6 are formed by the wet process such as the printing method, the spin coating method, and the inkjet method. Alternatively, the dry process may be used, such as the vacuum deposition method, the electron beam deposition method, the sputtering method, the reactive sputtering method, the ion plating method, and the CVD method. The wet process such as the inkjet method should preferably be used for cost reduction.

(Electron Transport Layers)

The first electron transport layer 7 has a function of transporting electrons, which are injected from the charge generation layer 8 which is described later, to the organic light-emitting layers 6. The first electron transport layer 7 is disposed as a solid film over the entire pixels on the organic light-emitting layers 6R, 6G, and 6B so as to extend over the openings 2R, 2G, and 2B.

The first electron transport layer 7 is made for example of nitro-substituted fluorenone derivative, thiopyran dioxide derivative, diphenylquinone derivative, perylene tetracarboxyl derivative, anthraquinodimethane derivative, fluoronylidene methane derivative, anthrone derivative, oxadiazole derivative, perinone derivative, or quinoline complex derivative (all disclosed in Japanese Patent Application Publication No. H5-163488), or phosphorus oxide derivative, triazole derivative, triazine derivative, silole derivative, dimesitylboron derivative, or triarylboron derivative.

Note that from the perspective of further improving the electron injection property, the above materials of the first electron transport layer 7 may be doped with alkali metal or alkaline-earth metal such as Na, Ba, and Ca.

The second electron transport layer 10 has a function of transporting electrons, which are injected from the cathode 11, to the second blue organic light-emitting layer 9. The second electron transport layer 10 is disposed as a solid film over the entire pixels on the second blue organic light-emitting layer 9 so as to extend over the openings 2R, 2G, and 2B.

The second electron transport layer 10 may be made of the same material as the first electron transport layer 7.

Also, the second electron transport layer 10 should preferably have a larger thickness than the first electron transport layer 7 in order to protect the second blue organic light-emitting layer 9 during formation of the second electron transport layer 10. For example, the first electron transport layer 7 should preferably have a thickness of 5 nm to 19 nm, and the second electron transport layer 10 should preferably have a thickness of 30 nm to 35 nm.

(Charge Generation Layer)

The charge generation layer 8 has a function of supplying holes to the second blue organic light-emitting layer 9 and supplying electrons from respective parts of the red, green, and blue subpixel regions to the organic light-emitting layers 6R, 6G, and 6B, respectively. The charge generation layer 8 is disposed as a solid film over the entire pixels on the first electron transport layer 7 so as to extend over the openings 2R, 2G, and 2B.

The charge generation layer 8 is a laminate or a mixture of an electron acceptor material and an electron donor material. In the interface or the border between the electron acceptor material and the electron donor material, charges, which result from reaction including electron movement between the electron acceptor material and the electron donor material, moves towards the cathode 11 and the anodes 3 when voltage is applied. As a result, holes are supplied to the second blue organic light-emitting layer 9, which is positioned on the side of the cathode 11 relative to the charge generation layer 8, and electrons are supplied to the organic light-emitting layers 6, which are positioned on the side of the anodes 3 relative to the charge generation layer 8, via the first electron transport layer 7. Accordingly, the charge generation layer 8 is made of a material that is a laminate or a mixture of two different types of substances, and the material forms charge transfer complex composed of radical cation and radical anion between the two types of substances by redox reaction. Radical cationic state and radical anionic state in the charge transfer complex, that is, holes and electrons in the charge transfer complex move towards the cathode 11 and the anode 3, respectively when voltage is applied.

The charge generation layer 8 is made for example of a laminate that is composed of a metal thin film such as Ag, Au, and Al, metal oxide such as vanadium oxide, molybdenum oxide, rhenium oxide, and tungsten oxide, a transparent conductive film such as ITO, IZO, AZO, GZO, ATO, and $SnO_2$, and so on. The charge generation layer 8 should preferably be made of a laminate of an n-type semiconductor and a p-type semiconductor, a laminate of one of a metal film and a transparent conductive film and at least one of an n-type semiconductor and a p-type semiconductor, a mixture of an n-type semiconductor and a p-type semiconductor, a mixture of metal and at least one of an n-type semiconductor and a p-type semiconductor and metal, or the like.

Specifically, the electron acceptor material is for example $V_2O_5$, $MoO_3$, $WO_3$, or tetracyanoquinodimethane (TCNQ) which is an organic semiconductor having n-type semiconductor characteristics. The electron donor material is for example aryl derivative. Also, the charge generation layer 8 should preferably be made of a strong electron acceptor material such as $HATCN_6$, and a hole transport layer, which is adjacent to the strong electron acceptor material and is on the side of the cathode 11, should be made of an electron donor material such as NPB (disclosed in Organic Electronics 12 (2011) 710-715).

Alternatively, Al/Au, Cu/Ag, hexadecafluorocopperphthalocyanine/copperphthalocyanine ($F_{16}$CuPc/CuPc), Al/$WO_3$/Au, or the like may be used (disclosed in APPLIED PHYSICS LETTERS 91, 123504, 2007).

(Second Blue Organic Light-Emitting Layer)

Similarly to the organic light-emitting layers 6, the second blue organic light-emitting layer 9 emits light through recombination of carriers (holes and electrons), and includes an organic material emitting light corresponding to the blue color. The second electro transport layer 10 and the second blue organic light-emitting layer 9, which contains an organic material emitting blue light, are disposed as a solid film over the entire pixels so as to extend over the openings 2R, 2G, and 2B.

The second electron transport layer 10 may be made of the same material as the first electron transport layer 7.

The first electron transport layer 7, the charge generation layer 8, the second blue organic light-emitting layer 9, and the second electron transport layer 10, which are described above, are formed by the dry process such as the vacuum deposition method, the electron beam deposition method, the sputtering method, the reactive sputtering method, the ion plating method, and the CVD method. The vacuum deposition method should preferably be used. This is because of the following reason. A blue organic light-emitting layer, which is formed by the dry process such as vacuum deposition, is made of a fluorescent material, but exhibits a higher luminous efficiency than a blue organic light-emitting layer, which is formed by the wet process. Accordingly, by using the blue organic light-emitting layer, which is formed by the vacuum process, for the second blue organic light-emitting layer, it is possible to effectively compensate the luminance of the blue organic light-emitting layer which is lower than those of the red and green organic light-emitting layers.

(Cathode)

The cathode 11 functions as a negative electrode for the organic EL element. The cathode 11 includes a transparent conductive layer that is made of a conductive material translucent with respect to light emitted from the organic light-emitting layers 6. The transparent conductive layer should preferably be made for example of ITO or IZO.

Also, the cathode 11 may be a multi-layer film by layering a metal layer (not shown) on the transparent conductive layer. The metal layer is made for example of silver (Ag), gold (Au), platinum (Pt), palladium (Pd), nickel (Ni), copper (Cu), aluminum (Al), or alloy of these metals.

The cathode 11 may be covered with a thin passivation layer (not shown). The thin passivation layer has a function of preventing the layers, which are interposed between the substrate 1 and the thin passivation layer, from being exposed to moisture and air and performing optical adjustment. The thin passivation layer is made for example of silicon nitride (SiN), silicon oxynitride (SiON), or resin.

The cathode 11 is formed by the dry process such as the vacuum deposition method, the electron beam deposition method, the sputtering method, the reactive sputtering method, the ion plating method, and the CVD method, and should preferably be formed by the sputtering method.

(Resin Passivation Layer)

The resin passivation layer 12 has a function of adhering a back panel, which is composed of the substrate 1 and the layers ranging from the anodes 3 to the thin passivation layer, to the cover glass 15, on which the red color filters 14R, the green color filters 14G, and the blue color filters 14B are disposed. The resin passivation layer 12 also has a function of preventing the layers from being exposed to moisture and air. The resin passivation layer 12 is made for example of a resin adhesive.

(Light Conversion Layers)

The first light conversion layer 13R is disposed above the second blue organic light-emitting layer 9 within each opening 2R in each red subpixel region, and has a function of converting blue light, which is emitted from the second blue organic light-emitting layer 9 in the red subpixel region, to red light. The second light conversion layer 13G is disposed above the second blue organic light-emitting layer 9 within each opening 2G in each green subpixel region, and has a function of converting blue light, which is emitted from the second blue organic light-emitting layer 9 in the green subpixel region, to green light.

The first light conversion layer 13R and the second light conversion layer 13G (hereinafter, referred to collectively as light conversion layers 13 when no distinction is made therebetween) only need to contain fluorescent colorant that absorbs the above light emitted from the second blue organic light-emitting layer 9 and performs wavelength conversion on the light.

The first light conversion layer 13R is made for example of cyanine colorant such as 4-dicyanomethylene-2-methyl-6-(p-dimethylaminostyryl)-4H-pyran, pyridine colorant such as 1-ethyl-2-(4-(p-dimethylaminophenyl)-1, 3-butadienyl)-pyridium-perchlorate, rhodamine colorant such as rhodamine B, rhodamine 6G, rhodamine 3B, rhodamine 101, rhodamine 110, sulforhodamine, basic violet 11, and basic red 2, or oxazine colorant (all disclosed in Japanese Patent Application Publication No. H9-279394).

The second light conversion layer 13G is made for example of coumarin colorant such as 2, 3, 5, 6-1H, 4H-tetrahydro-8-trifluoromethylmethylquiolizino (9, 9a, 1-gh) coumarin, 3-(2'-benzothiazolyl)-7-diethylaminocoumarin, 3-(2'-benzimidazolyl)-7-diethylaminocoumarin, and 3-(2'-N-methylbenzimidazolyl)-7-diethylamino-coumarin, basic yellow 51 which is coumarine colorant dye, or naphthalimide colorant such as solvent yellow 11 and solvent yellow 116 (all disclosed in Japanese Patent Application Publication No. H9-279394).

Alternatively, any type of fluorescent dye other than the above dyes may be used, such as direct dye, acid dye, basic dye, and disperse dye. Further alternatively, a mixture of two or more types of the dyes may be used.

The light conversion layers 13 may be any film such as a film that is formed by performing deposition or sputtering on fluorescent colorant such as exemplified above and a film that is formed by dispersing such fluorescent colorant in appropriate resin as resin having a binding property. In the case where the main material of the light conversion layers 13 is the fluorescent colorant, film formation is performed by the vacuum deposition method or the sputtering method with use of a mask of a desired fluorescent layer pattern. On the other hand, in the case where the material of the light conversion layers 13 is the fluorescent colorant and the resin, the fluorescent colorant, the resin, and resist are mixed, dispersed, or solubilized, film formation is performed by the spin coating method, the roll coating method, the casting method, or the like, and patterning is performed by the photolithography method, the screen printing method, or the like with use of a desired fluorescent layer pattern.

In this case, a transparent material (having light transparency to at least 50% visible light) is preferable as matrix resin, and various types of thermoplastic resins may be used. The matrix resin should preferably not cause decomposition and deformation against heating normally at 100 degrees C. and preferably at 150 degrees C. The matrix resin is specifically for example acrylic resin such as polymethacrylic acid ester, alkyd resin, aromatic hydrocarbon resin such as polystyrene, cellulosic resin, polyester resin such as polyethylene terephthalate, polyimide resin such as nylon, polyurethane resin, polyvinyl acetate resin, polyvinyl alcohol resin, or a mixture of these resins.

The light conversion layers 13 may have any thickness that does not block a function of sufficiently absorbing light emitted from the second blue organic light-emitting layer 9 to generate fluorescence. An appropriate thickness of the light conversion layers 13 is approximate 10 nm to 5 mm. In the present embodiment, the light conversion layers 13 have a thickness of 5 μm to 30 μm, and should preferably have a thickness of 7 μm to 15 μm. As a result, it is possible to obtain output light, which has undergone color conversion, at a desired intensity.

Adjustment of the thickness of the light conversion layers 13 changes transmission intensity of light emitted from the organic light-emitting layers 6. Reduction of the thickness of the light conversion layers 13 increases the transmission amount of light emitted from the organic light-emitting layers 6. Increase of the thickness of the light conversion layers 13 reduces the amount of transmission components from the organic light-emitting layers 6, and increases the amount of fluorescent components. It is preferable to appropriately adjust the thickness of the light conversion layers 13 such that light of the transmission components and the fluorescent components exhibits the maximum luminance.

(Color Filters)

The red color filters 14R, the green color filters 14G, and the blue color filters 14B are disposed above the opening 2R, 2G, and 2B so as to correspond in position to the red, green, and blue subpixels, respectively. The red color filters 14R, the green color filters 14G, and the blue color filters 14B (hereinafter, referred to collectively as color filters 14 when no distinction is made therebetween) are each a transparent layer that is provided for transmitting visible light of wavelength corresponding to one of the R, G, and B colors, and have a function of transmitting light emitted from a corresponding one of the red, green, and blue subpixels and correcting the chromaticity of the light. The color filters 14 are specifically formed for example by applying an ink containing a color filter material and solvent onto the cover glass 15 for color filter formation that has provided therein a barrier rib with apertures provided in units of subpixels in a matrix.

<Whole Structure and Outer Appearance of Display Device>

Figure 2:
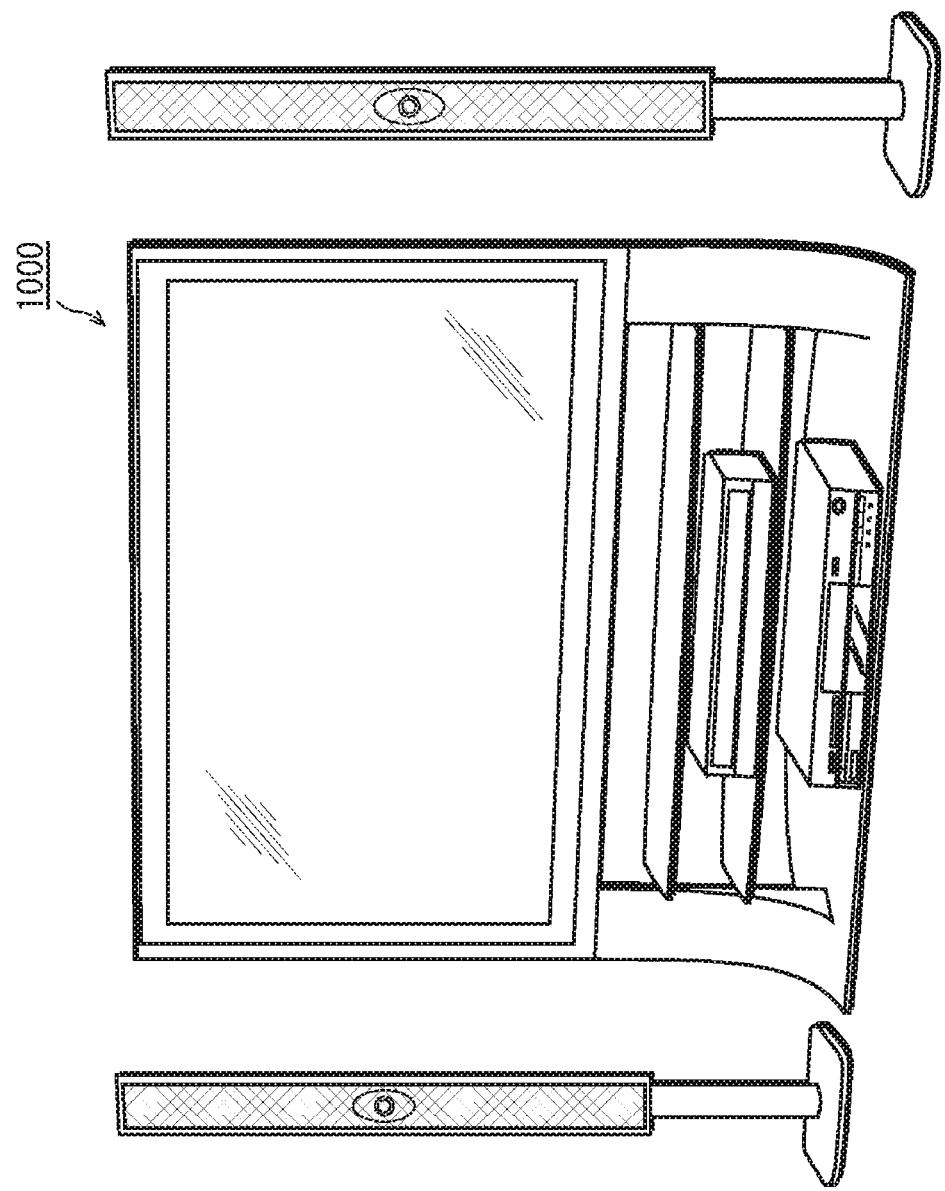
FIG. 2 shows an example of an outer appearance of a display device 1000 relating to Embodiment 1.
Figure 3:
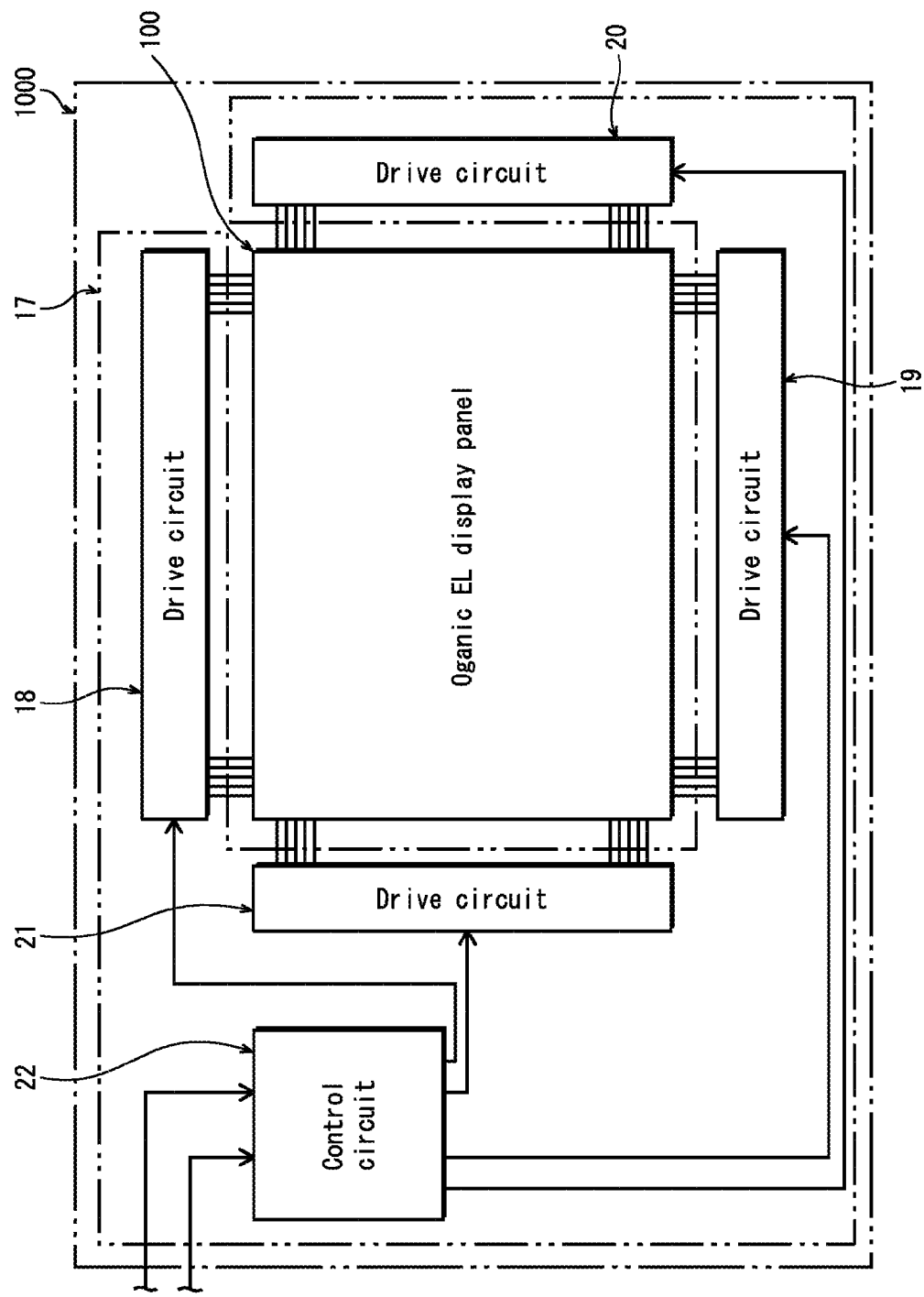
FIG. 3 shows functional blocks of the display device 1000 relating to Embodiment 1.

FIG. 2 shows an example of an outer appearance of a display device 1000 relating to the present embodiment. FIG. 3 shows functional blocks of the display device 1000 relating to the present embodiment. The display device 1000 includes the display panel 100 and a drive control unit 17 that are electrically connected to each other. The display panel 100 has the pixel structure shown in FIG. 1. The drive control unit 17 includes drive circuits 18 to 21 that apply voltage between the anode 3 corresponding to each organic EL element and the cathode 11, and a control circuit 22 that controls operations of the drive circuits 18 to 21.

<Manufacturing Method of Display Panel 100>

The following explains a manufacturing method of the display panel 100 with reference to FIG. 4A to FIG. 6D. FIG. 4A to FIG. 6D are views for explaining the manufacturing method of the display panel 100 relating to Embodiment 1.

Figure 4A:
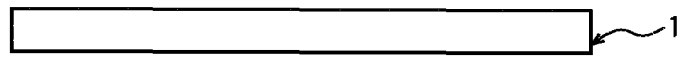
FIG. 4A to FIG. 4F are views for explaining a manufacturing method of the organic EL display panel 100 relating to Embodiment 1.

First, a substrate 1 is prepared (FIG. 4A).

Figure 4B:
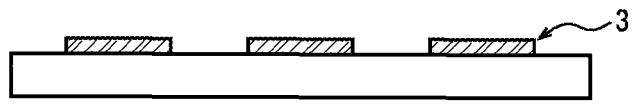

Next, anodes 3 are formed on the substrate 1 so as to have a thickness of approximate 150 nm by the dry process such as the vacuum deposition method and the sputtering method (FIG. 4B). Further, transparent conductive layers (not shown) are formed on the respective anodes 3 from ITO or IZO by the vacuum deposition method, the sputtering method, or the like (FIG. 4B). Here, the thickness of the transparent conductive layers is appropriately adjusted so as to fall within the range described above.

Figure 4C:
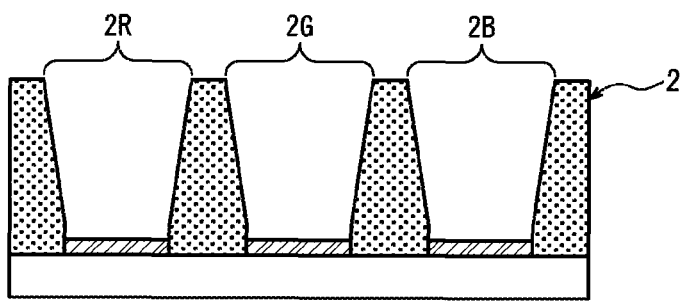

Next, a bank 2 is formed on the substrate 1 (FIG. 4C). In the present embodiment, the bank 2 is made of a photosensitive resin material containing a repellent agent by the photolithography method. Here, the photosensitive resin material is for example a known resist material which is acrylic resin, polymide resin, phenolic resin, or the like.

Specifically, a material of the bank 2 is applied onto the substrate 1 to form a film for example by the spin coating method. Masks are aligned in accordance with respective patterns of the openings 2R, 2G, and 2B, which are defined such that the anodes 3 are exposed, and exposure is performed on the film. Then, the film is etched for example with use of alkaline developer as non-aqueous developer to form the openings 2R, 2G, and 2B. Thermal process is performed on the film at a temperature of 200 degrees C. to 250 degrees C., for example at a temperature of 200 degrees C. to evaporate solvent and so on included in the film. This completes the bank 2.

Figure 4D:
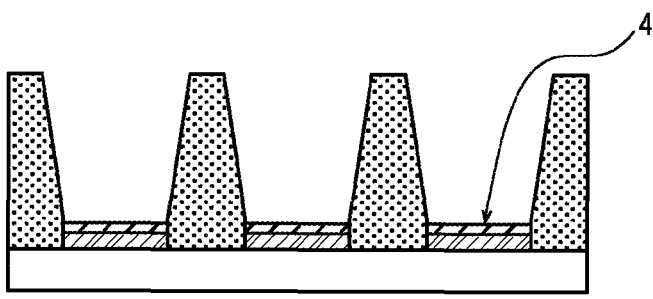
Figure 4E:
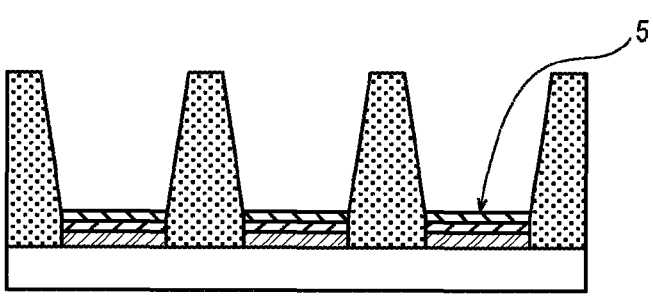

Next, hole injection layers 4 are formed on the respective transparent conductive layers for example by the wet process such as the inkjet method (FIG. 4D). Further, hole transport layers 5 are formed on the respective hole injection layers 4 for example by the wet process such the inkjet method (FIG. 4E). Here, as described above, the respective hole injection layers 4 disposed within the openings 2R, 2G, and 2B have thicknesses independent from each other, and may have different thicknesses. Similarly, the respective hole transport layers 5 disposed within the respective openings 2R, 2G, and 2B may have different thicknesses. Further, the hole injection layers 4 may not need to be provided within part or all of the openings 2R, 2G, and 2B. The same applies to the hole transport layers 5.

Figure 4F:
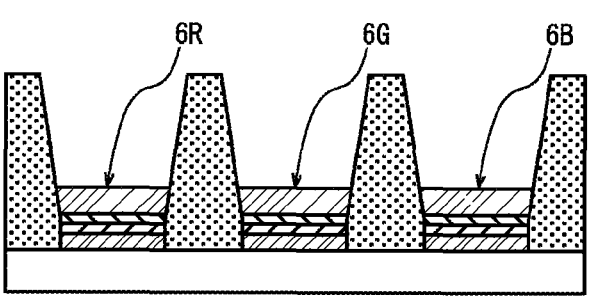

Next, organic light-emitting layers 6R, 6G, and 6B are formed on a corresponding one of the hole transport layers 5 for example by the wet process such as the inkjet method (FIG. 4F). The organic light-emitting layers 6R, 6G, and 6B have a thickness of approximate 50 nm, for example.

Specifically, an ink for functional layers is adjusted by mixing a functional material of the organic light-emitting layers 6R, 6G, and 6B and solvent at a predetermined ratio. This ink is applied so as to cover exposed regions of the anodes 3 by dropping ink droplets of the ink through the openings 2R, 2G, and 2B from an inkjet head by the inkjet method. Then, the solvent contained in the ink is evaporated and dried, and is further heated and baked as necessary. As a result, the organic light-emitting layers 6R, 6G, and 6B are formed.

A material of the ink as solute is for example polyphenylenevinylene, polyphenylenevinylene derivative, polyacetylene, polyacetylene derivative, polyphenylene, polyphenylene derivative, polyp araphenyleneethylene, polyparaphenyleneethylene derivative, poly3-hexylthiophene, poly3-hexylthiophene derivative, polyfluoren, or polyfluorene derivative.

A material of the ink as solvent is for example aromatic organic solvent such as toluene, xylene, tetralin, and anisole, ether solvent such as dioxane, or alcohol solvent such as isopropyl alcohol.

An organic polymeric material of the light-emitting layers 6 is for example a polymeric material such as polyfluorene, polyparaphenylene vinylene, polyacetylene, polyphenylene, polyparaphenylene ethylene, poly(3-hexylthiophene), and any of respective derivatives of these components, or a fluorescent material such as oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of 8-hydroxyquinoline compound, metal complex of 2-bipyridine compound, complex of Schiff base and group III metal, metal complex of oxine, and rare earth metal complex.

As described above, the hole injection layers 4, the hole transport layers 5, and the organic light-emitting layers 6 are formed by the wet process such as the printing method, the spin coating method, and the inkjet method. Alternatively, the dry deposition method may be used, such as the vacuum deposition method, the electron beam deposition method, the sputtering method, the reactive sputtering method, the ion plating method, and the CVD method. The wet process such as the inkjet method should preferably be used for cost reduction.

Figure 5A:
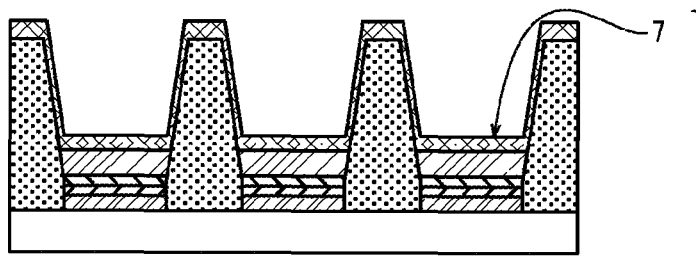
FIG. 5A to FIG. 5E are views for explaining the manufacturing method of the organic EL display panel 100 relating to Embodiment 1.

Next, a first electron transport layer 7 is formed as a solid film over the entire pixels so as to cover the organic light-emitting layers 6R, 6G, and 6B and extend over the openings 2R, 2G, and 2B by the dry process such as the vacuum deposition method (FIG. 5A).

Figure 5B:
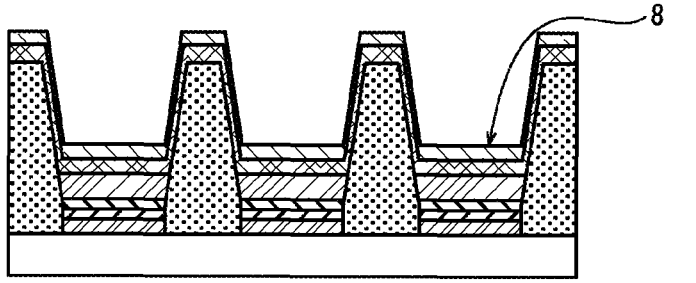

Next, a charge generation layer 8 is formed on the first electron transport layer 7 as a solid film over the entire pixels so as to extend over the openings 2R, 2G, and 2B by the dry process such as the vacuum deposition method (FIG. 5B).

Figure 5C:
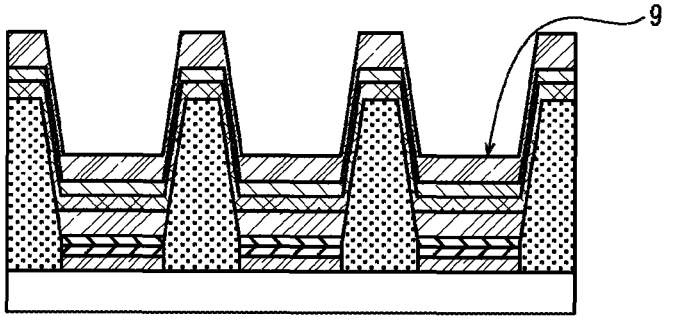

Next, a second blue organic light-emitting layer 9 is formed on the charge generation layer 8 as a solid film over the entire pixels so as to extend over the openings 2R, 2G, and 2B by the dry process such as the vacuum deposition method (FIG. 5C).

Figure 5D:
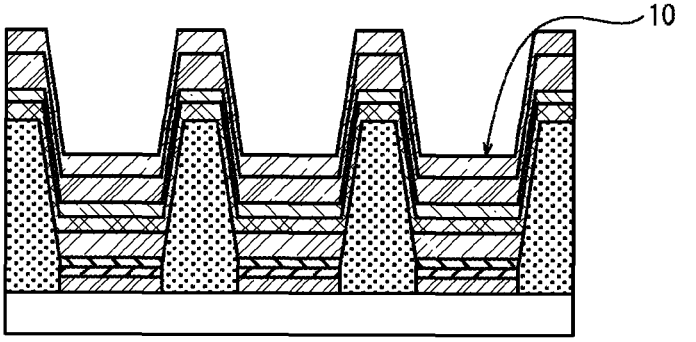

Next, a second electron transport layer 10 is formed on the second blue organic light-emitting layer 9 as a solid film over the entire pixels so as to extend over the openings 2R, 2G, and 2B by the dry process such as the vacuum deposition method (FIG. 5D).

Here, the second electron transport layer 10 should preferably have a larger thickness than the first electron transport layer 7. For example, the first electron transport layer 7 should preferably have a thickness of 5 nm to 30 nm, and the second electron transport layer 10 should preferably have a thickness of 30 nm to 35 nm. This is in order to prevent the second blue organic light-emitting layer 9 from being damaged due to sputtering on the second electron transport layer 10 during formation of a cathode 11 on the second electron transport layer 10 by the sputtering method or the like.

As described above, the first electron transport layer 7, the charge generation layer 8, the second blue organic light-emitting layer 9, and the second electron transport layer 10 are formed by the dry process such as the vacuum deposition method, the electron beam deposition method, the sputtering method, the reactive sputtering method, the ion plating method, and the CVD method. The vacuum deposition method should preferably be used. By depositing the films to the entire pixel regions, it is possible to prevent the loss of deposition materials which has been caused by adhesion of the deposition materials to the entire mask including apertures formed by the shadow mask method, thereby efficiently utilizing the deposition materials. Also, since apertures of a precise mask do not need to be aligned with parts of the bank for the blue subpixels at a high precision, it is possible to improve the productive efficiency. This contributes to the material cost reduction and the productive efficiency improvement.

Figure 5E:
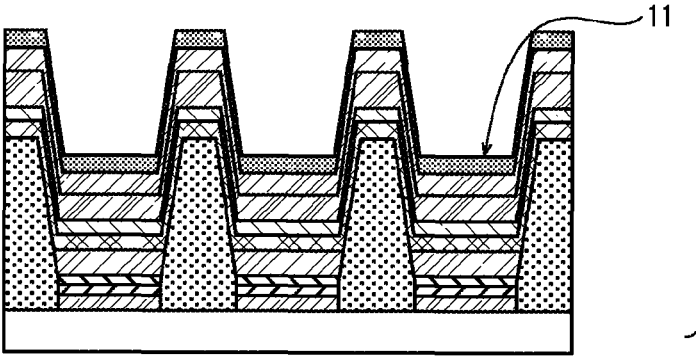

Next, the cathode 11 is formed on the second electron transport layer 10 as a solid film over the entire pixels so as to extend over the openings 2R, 2G, and 2B (FIG. 5E).

The cathode 11 is formed from for example ITO by the vacuum deposition method, the sputtering method, the reactive sputtering method, the ion plating method, the plasma CVD method, the laser CVD method, the thermal CVD method, or the like. The cathode 11 should preferably be formed by the sputtering method.

Next, a resin passivation layer 12 is formed on the cathode 11 (FIG. 6A). The resin passivation layer 12 is made for example of a resin adhesive.

Next, color filters 14R, 14G, and 14B are formed on a cover glass 15 (FIG. 6B).

As described above, the color filters 14 are formed for example by applying an ink containing a color filter material and solvent onto the cover glass 15 for color filter formation that has provided therein a barrier rib with apertures provided in units of subpixels in a matrix.

Next, a first light conversion layer 13R is formed on each color filter 14R, and a second light conversion layer 13G is formed on each color filter 14G (FIG. 6C).

As described above, the light conversion layers 13 may be any film such as a film that is formed by performing deposition or sputtering on fluorescent colorant and a film that is formed by dispersing such fluorescent colorant in appropriate resin as resin having a binding property.

In the case where the main material of the light conversion layers 13 is the fluorescent colorant, film formation is performed by the vacuum deposition method or the sputtering method with use of a mask of a desired fluorescent layer pattern.

On the other hand, in the case where the material of the light conversion layers 13 is the fluorescent colorant and the resin, the fluorescent colorant, the resin, and resist are mixed, dispersed, or solubilized, film formation is performed by the spin coating method, the roll coating method, the casting method, or the like, and patterning is performed by the photolithography method, the screen printing method, or the like with use of a desired fluorescent layer pattern.

Next, the cover glass 15, on which the red color filter 14R, the green color filter 14G, and the blue color filter 14B and the light conversion layers 13 are formed, is adhered onto the resin passivation layer 12 (FIG. 6D). At this time, the cover glass 15 is adhered to the substrate 1 by curing the resin passivation layer 12.

<Operations of Display Panel 100>

Figure 7:
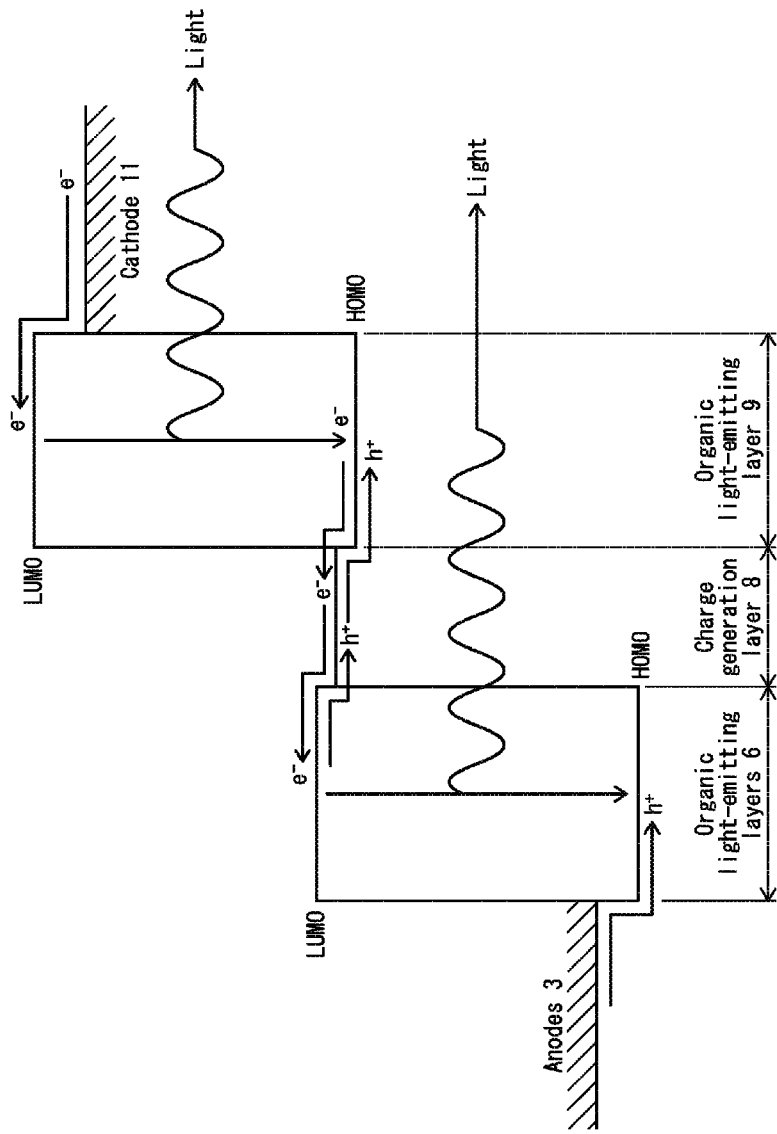
FIG. 7 is a schematic view showing energy states of organic light-emitting layers 6 and a second blue organic light-emitting layer 9 of the organic EL display panel 100 relating to Embodiment 1.

The following explains the operations of the display panel 100 with reference to the drawings. FIG. 7 is a schematic view showing energy states of the organic light-emitting layers 6 and the second blue organic light-emitting layer 9 of the display panel 100 relating to Embodiment 1.

As shown in FIG. 7, holes are supplied from the anodes 3 to the highest occupied molecular orbital (HOMO) of the organic light-emitting layers 6 while voltage is applied between each of the anodes 3 and the cathode 11. Also, electrons are supplied from the cathode 11 to the lowest unoccupied molecular orbital (LUMO) of the second blue organic light-emitting layer 9.

As described above, the charge generation layer 8 is made of a material that is a laminate or a mixture of an electron acceptor material and an electron donor material. In the interface or the border between the electron acceptor material and the electron donor material, charges, which results from reaction including electron movement between the electron acceptor material and the electron donor material, moves towards the cathode 11 and the anodes 3 when voltage is applied. As a result, holes are supplied to the HOMO of the second blue organic light-emitting layer 9, which is positioned on the side of the cathode 11 relative to the charge generation layer 8, and electrons are supplied to the LUMO of the organic light-emitting layers 6, which are positioned on the side of the anodes 3 relative to the charge generation layer 8, via the first electron transport layer 7.

Then, holes, which are supplied from the anodes 3 to the organic light-emitting layers 6, and electrons, which are supplied from the charge generation layer 8 to the organic light-emitting layers 6, recombine with each other in the organic light-emitting layers 6, and this recombination causes an excited state to emit light. Also, holes, which are supplied from the charge generation layer 8 to the second blue organic light-emitting layer 9, and electrons, which are supplied from the cathode 11 to the second blue organic light-emitting layer 9, recombine with each other in the second blue organic light-emitting layer 9, and this recombination causes an excited state to emit light. As a result, in the organic light-emitting layers including the organic light-emitting layers 6 and the second blue organic light-emitting layer 9, recombination of electrons and holes causes light emissions between the electrodes. This causes light emission from both the organic light-emitting layers 6 and the second blue organic light-emitting layer 9 at the same current, and thereby improves the luminous efficiency of the display panel.

Figure 8:
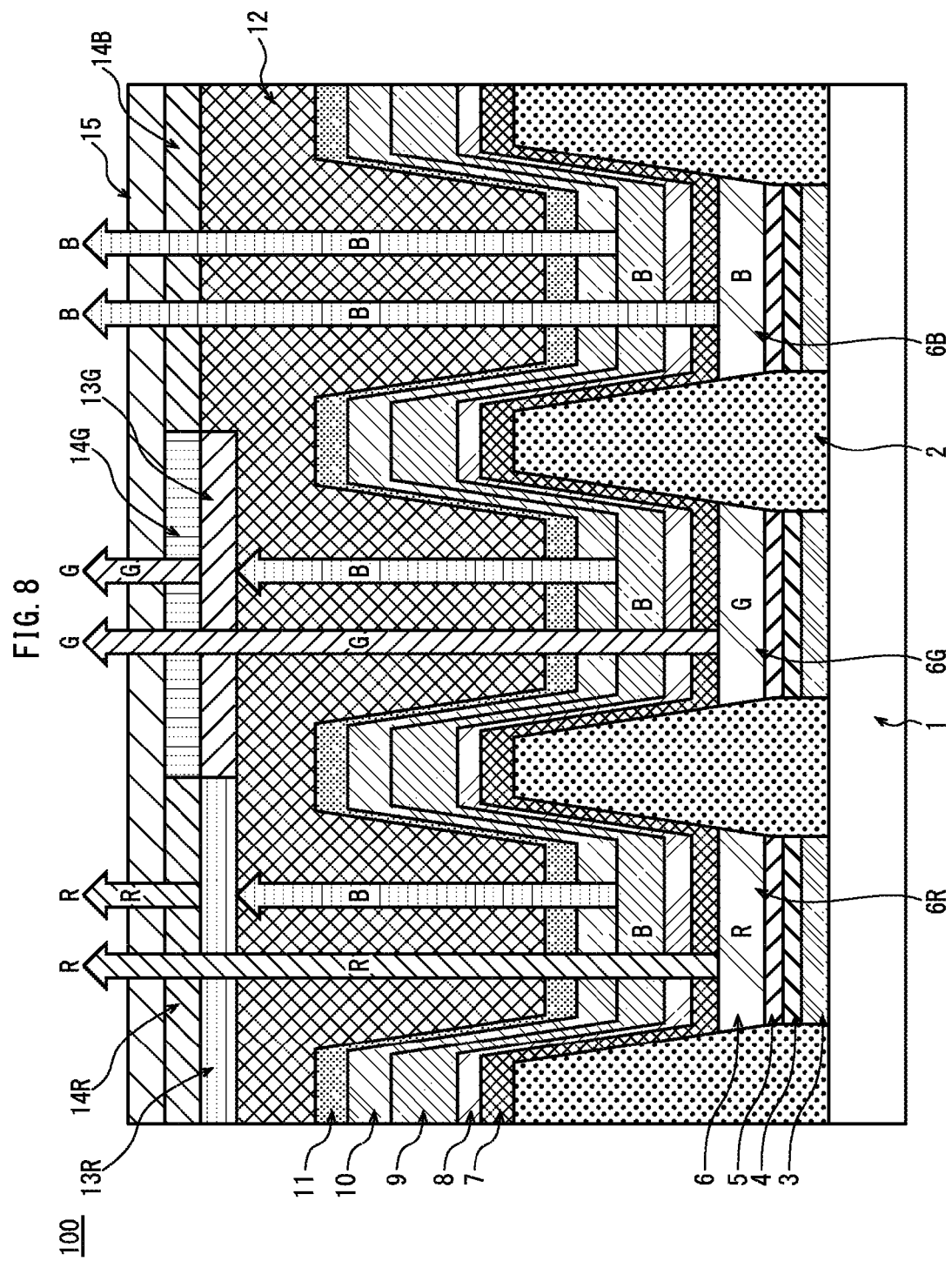
FIG. 8 is a cross-sectional view schematically showing a display function of the organic EL display panel 100 relating to Embodiment 1.

FIG. 8 is a cross-sectional view showing a display function of the display panel 1 relating to Embodiment 1. As shown in FIG. 8, in each red subpixel region, red light, which is emitted from the organic light-emitting layer 6R within a corresponding opening 2R, and blue light, which is emitted from part of the second blue organic light-emitting layer 9 in the red subpixel region, travel towards the first light conversion layer 13R which is disposed on the cover glass 15. The blue light, which travels towards the first light conversion layer 13R, is wavelength-converted to red light by a wavelength converter included in the first light conversion layer 13R. This wavelength conversion is performed at a conversion rate of approximate 30% to 90%, though depending on the materials. Then, the red light after conversion and the red light, which travels from the organic light-emitting layer 6R towards the first light conversion layer 13R, are added, and the light after addition is output upwards the cover glass 15 as red light with an increased color purity resulting from absorption of color components other than red components by the red color filter 14R.

Similarly, in each green subpixel region, green light, which is emitted from the organic light-emitting layer 6G within a corresponding opening 2G, and blue light, which is emitted from part of the second blue organic light-emitting layer 9 in the green subpixel region, travel towards the second light conversion layer 13G which is disposed on the cover glass 15. The blue light is wavelength-converted to green light by a wavelength converter included in the second light conversion layer 13G. This wavelength conversion is also performed at a conversion rate of approximate 30% to 90%. Then, the light after conversion and the green light, which travels from the organic light-emitting layer 6G towards the second light conversion layer 13G, are added, and the light after addition is output upwards the cover glass 15 as green light with an increased color purity resulting from absorption of color components other than green components by the green color filter 14G.

Also, in each blue subpixel region, blue light, which is emitted from the organic light-emitting layer 6B within a corresponding opening 2B, and blue light, which is emitted from part of the second blue organic light-emitting layer 9 in the blue subpixel region, travel towards the blue color filter 14B which is disposed on the cover glass 15. Then, the blue light, which travels towards the blue color filter 14B, is output upwards the cover glass 15 as blue light with an increased color purity resulting from absorption of color components other than blue components by the blue color filter 14B.

According to the display panel 100 relating to the present embodiment as described above, it is possible to convert respective blue light, which is emitted from the parts of the second blue light-emitting layer in the red and green subpixel regions, to red light and green light and emit the light after conversion as an output from the display panel 100. This improves the luminance in the red and green subpixel regions as well as in the blue subpixel regions. As a result, the current efficiency is increased, which indicates the intensity of the luminance of the display panel relative to the current, and therefore the luminous efficiency is improved.

<Effects>

As described above, the display panel 100 relating to the present embodiment includes pixels each of which is composed of a red pixel, a green pixel, and a blue subpixel, and have the following structure. Specifically, the display panel 100 includes: the substrate 1; the barrier rib 2 that is disposed on the substrate 1, and partitions between the red subpixel region, the green subpixel region, and the blue subpixel region of the respective red, green, and blue subpixels; the first pixel electrode 3 and the red organic light-emitting layer 6R that are disposed above the substrate 1 sequentially from the side of the substrate 1 in the red subpixel region; the second pixel electrode 3 and the green organic light-emitting layer 6G that are disposed above the substrate 1 sequentially from the side of the substrate 1 in the green subpixel region; the third pixel electrode 3 and the first blue organic light-emitting layer 6G that are disposed above the substrate 1 sequentially from the side of the substrate 1 in the blue subpixel region; the charge generation layer 8 that is disposed above the red organic light-emitting layer 6R, the green organic light-emitting layer 6G, and the first blue organic light-emitting layer 6B; the second blue organic light-emitting layer 9 that is disposed on the charge generation layer 8 in the red, green, and blue subpixel regions; the counter electrode 11 of the first, second, and third pixel electrodes 3 that is disposed above the second blue organic light-emitting layer 9 in the red, green, and blue subpixels regions; the first light conversion layer 13R that is disposed above the second blue organic light-emitting layer 9 in the red subpixel region, and converts blue light to red light; and the second light conversion layer 13G that is disposed above the second blue organic light-emitting layer 9 in the green subpixel region, and converts blue light to green light.

With this structure, it is possible to convert respective blue light, which is emitted from the parts of the second blue light-emitting layer in the red and green subpixels, to red light and green light and emit the light after conversion as an output from the display panel 100. This improves the luminance in the red and green subpixel regions as well as in the blue subpixel regions, and thereby improves the luminous efficiency.

Also, the following effects are exhibited with the structure in which the charge generation layer, the second blue organic light-emitting layer, and the cathode are formed by film deposition to the entire pixel regions, each of which is composed of the red, green, and blue subpixels. That is, it is possible to prevent the loss of deposition materials which has been caused by adhesion of the deposition materials to the entire mask including apertures formed by the shadow mask method, thereby efficiently utilizing the deposition materials. Also, since apertures of a precise mask do not need to be aligned with parts of the bank for the blue subpixels at a high precision, it is possible to improve the productive efficiency. This contributes to the material cost reduction and the productive efficiency improvement.

<Modification 1>

Although the explanation has been given on the display panel 100 relating to Embodiment 1, the exemplified display panel 100 may be modified as explained below. The present disclosure is of course not limited to the display panel 100 exactly as explained in the above embodiment.

The display panel 100 relating to the above embodiment includes the light conversion layers that convert respective blue light, which is emitted from the parts of the second blue organic light-emitting layer in the red and green subpixel regions, to red light and green light. However, the display panel relating to the present disclosure only needs to extract respective light from the parts of the second blue organic light-emitting layer in the red and green subpixel regions as well as from that in the blue subpixel regions, and emitting the extracted light as an output from the display panel.

Figure 9:
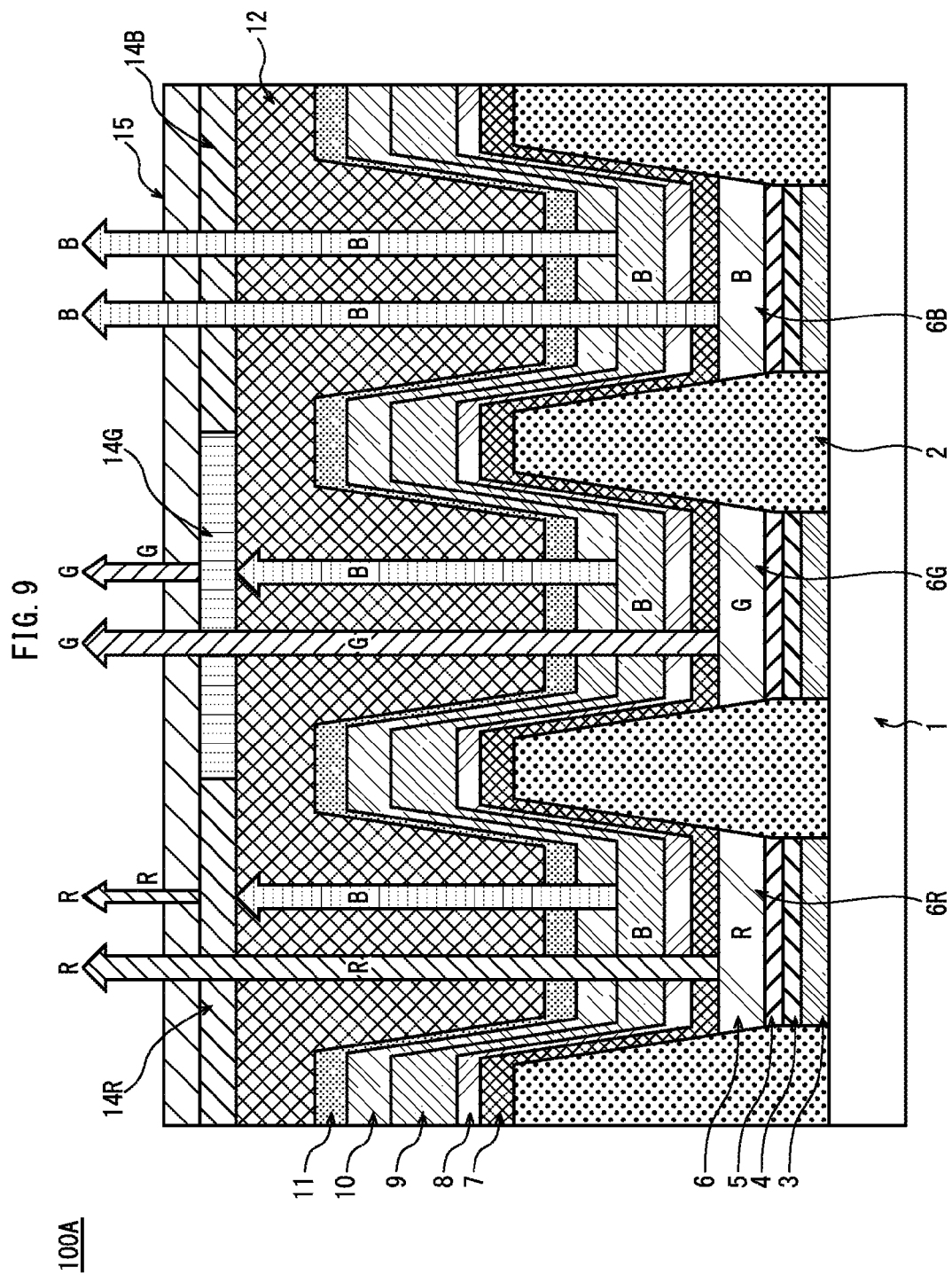
FIG. 9 is a cross-sectional view schematically showing the pixel structure in an organic EL display panel 100A relating to Modification 1.

FIG. 9 is a cross-sectional view schematically showing the pixel structure in an organic EL display panel 100A relating to Modification 1. As shown in FIG. 9, the organic EL display panel 100A (hereinafter, abbreviated as display panel 100A) has the same structure as the display panel 100 from which the first light conversion layer 13R and the second light conversion layer 13G are removed.

With this structure, the red color filter 14R absorbs color components other than red components from blue light, which is emitted from part of the second blue organic light-emitting layer in each red subpixel region, and red light remaining after absorption is added to red light, which is emitted from the organic light-emitting layer 6R, and the light after addition is externally emitted as an output from the display panel 100A. This blue light may transmit for example at a transmission rate of approximate 0% to 5%. Similarly, the green color filter 14G absorbs color components other than green components from blue light, which is emitted from part of the second blue organic light-emitting layer in each green subpixel region, and green light remaining after absorption is added to green light, which is emitted from the organic light-emitting layer 6G, and the light after addition is externally emitted as an output from the display panel 100A. This blue light may transmit for example at a transmission rate of approximate 0% to 5%.

As a result, respective blue light, which is emitted from the parts of the second blue organic light-emitting layer in the red and green subpixel regions, is partially emitted as an output from the display panel 100A, and this improves the luminous efficiency.

<Modification 2>

Also, the display panel 100 may include a third light conversion layer 13B above the cathode 11 in each blue subpixel region. The third light conversion layer 13B converts blue light, which is emitted from at least one of the first blue organic light-emitting layer 6B and the second blue organic light-emitting layer 9 in the blue subpixel region, to blue light having a different luminescence spectrum from the emitted blue light.

Figure 10:
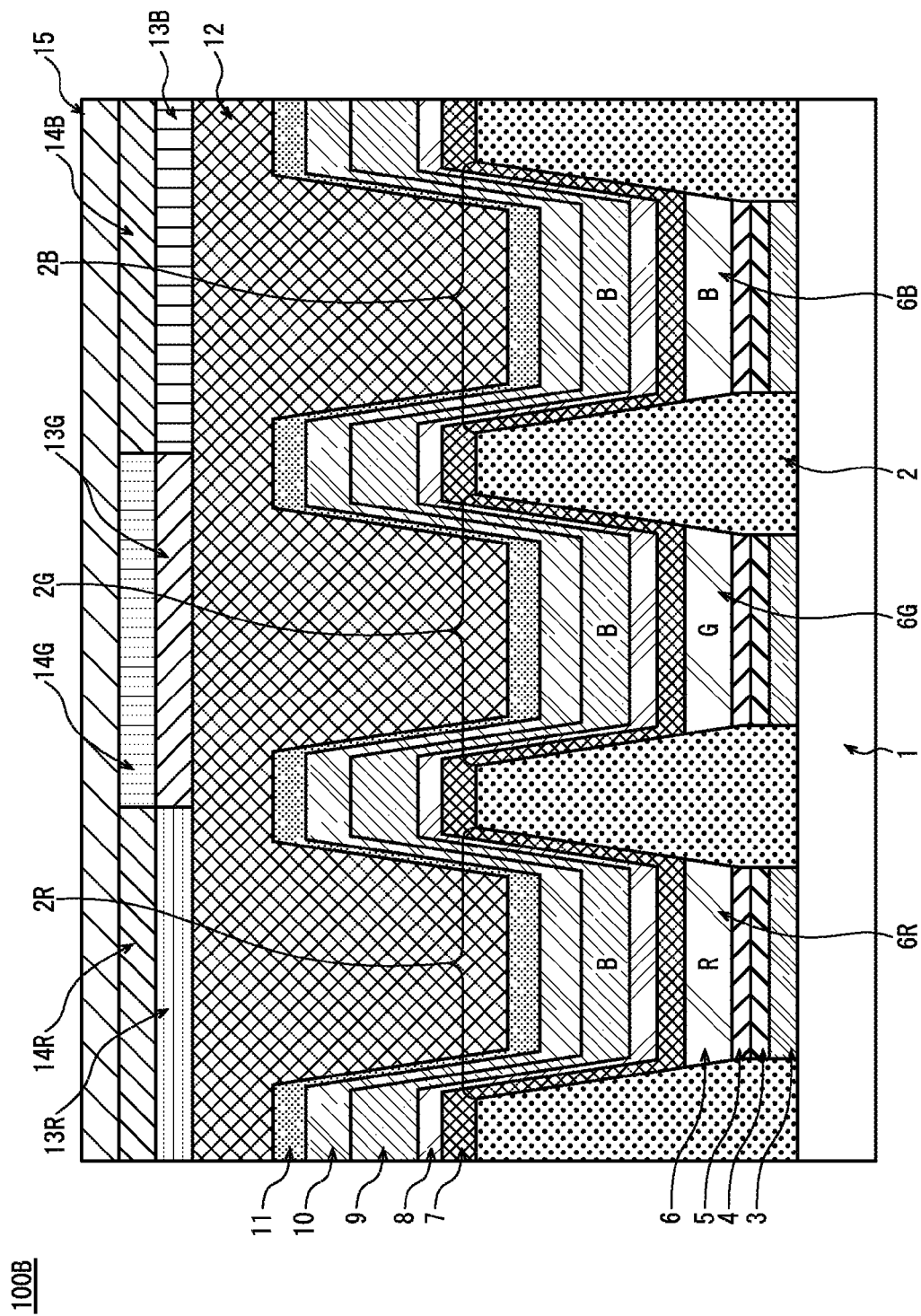
FIG. 10 is a cross-sectional view schematically showing the pixel structure in an organic EL display panel 100B relating to Modification 2.

FIG. 10 is a cross-sectional view schematically showing the pixel structure in an organic EL display panel 100B relating to Modification 2. According to the organic EL display panel 100B, the third light conversion layer 13B is disposed above the second blue organic light-emitting layer 9 above the opening 2B in each blue subpixel region, and has a function of converting blue light, which is emitted from at least one of the first blue organic light-emitting layer 6B and the second blue organic light-emitting layer 9 in the blue subpixel region, to blue light having a different luminescence spectrum from the emitted blue light. With this structure, blue light, which is emitted from the third light conversion layer 13B, is output upwards the cover glass 15 as blue light with a further increased color purity.

Embodiment 2

The following explains an organic EL display panel 200 (hereinafter, abbreviated as display panel 200) relating to Embodiment 2. While the display panel 100 includes pixels each of which is composed of red, green, and blue subpixels, the display panel 200 includes pixels each of which is composed of red, green, and blue subpixels and a subpixel of a dark blue (DB) color emitting dark blue light. This is the difference therebetween. The red, green, and blue subpixels in the display panel 200 are the same as those in the display panel 100, and accordingly explanation thereof is omitted.

Figure 11:
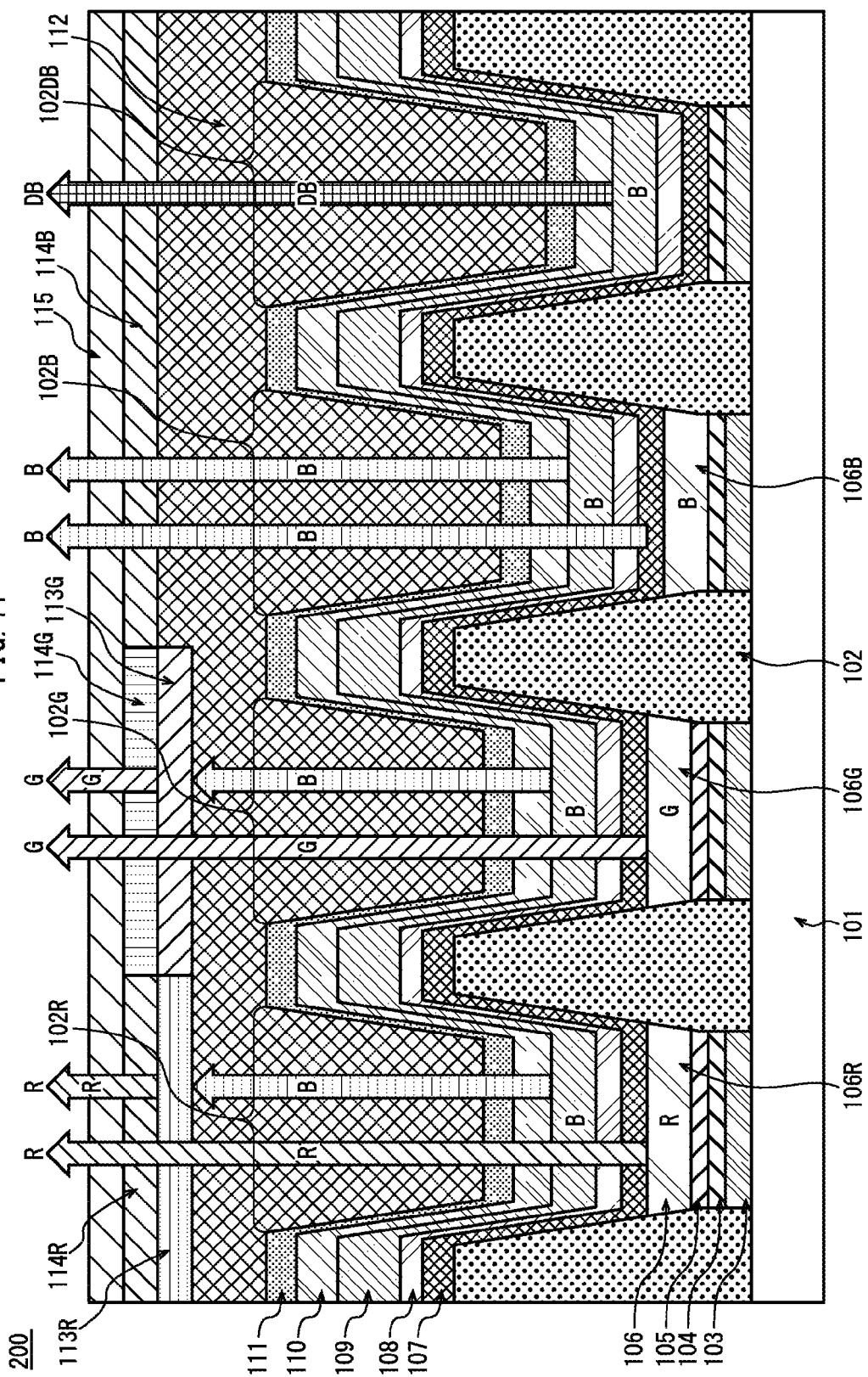
FIG. 11 is a cross-sectional view schematically showing the pixel structure in an organic EL display panel 200 relating to Embodiment 2.
Figure 12A:
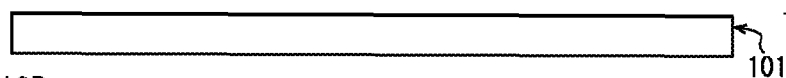
FIG. 12A to FIG. 12G are views for explaining a manufacturing method of the organic EL display panel 200 relating to Embodiment 2.
Figure 12B:
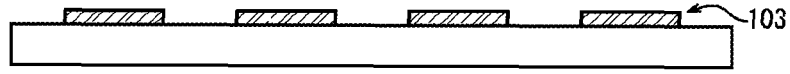
Figure 12C:
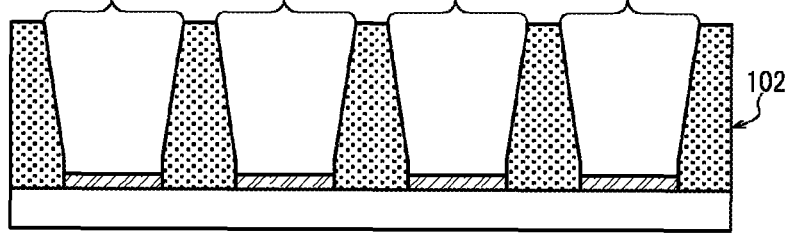
Figure 12D:
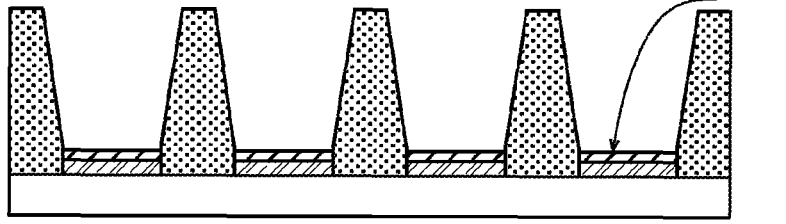
Figure 12E:
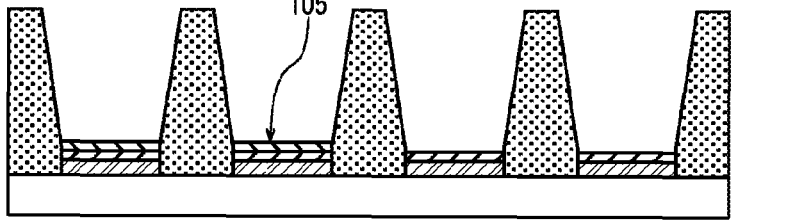
Figure 12F:
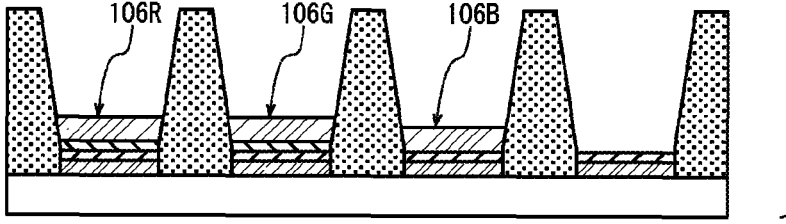
Figure 12G:
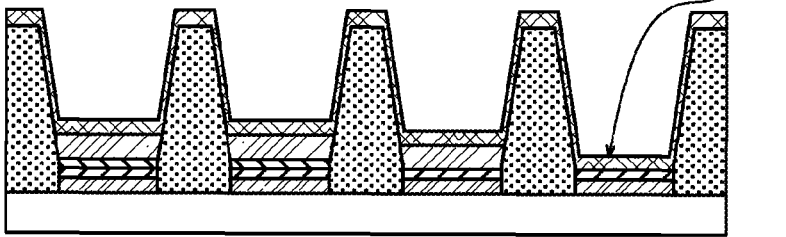
Figure 13A:
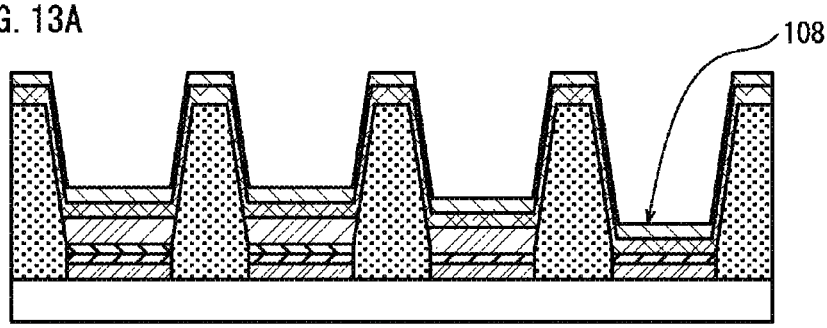
FIG. 13A to FIG. 13D are views for explaining the manufacturing method of the organic EL display panel 200 relating to Embodiment 2.
Figure 13B:
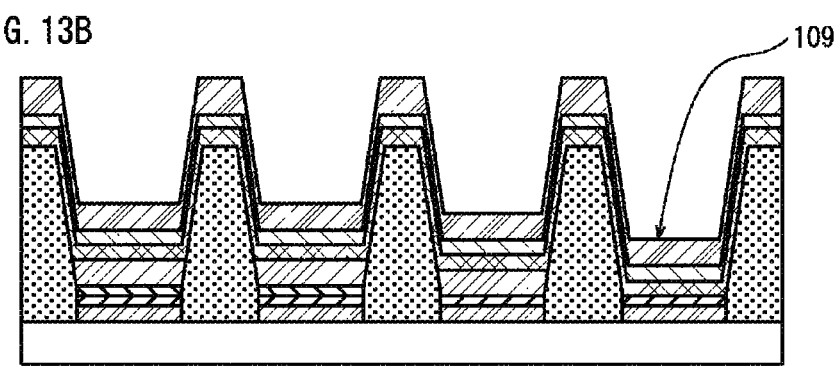
Figure 13C:
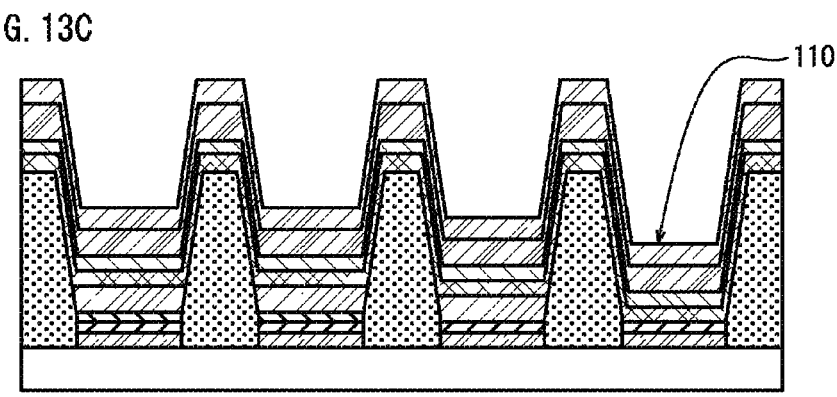
Figure 13D:
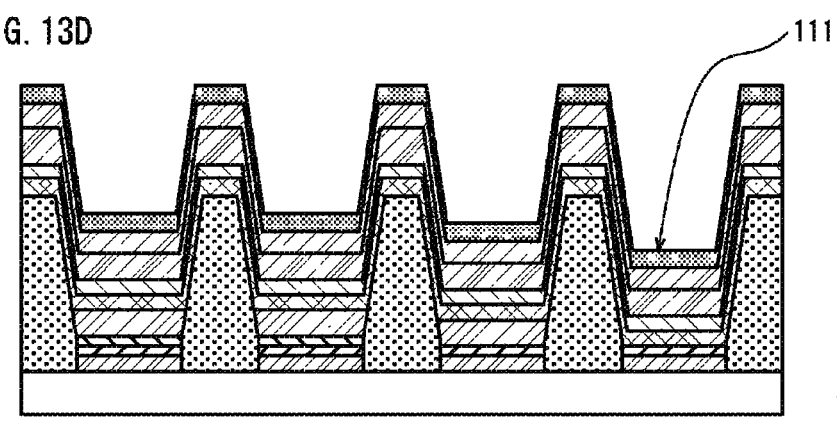

FIG. 11 is a cross-sectional view schematically showing the pixel structure in the display panel 200 relating to Embodiment 2. FIG. 12A to FIG. 14E are views for explaining a manufacturing method of the display panel 200 relating to Embodiment 2.

In FIG. 11A to FIG. 12G, the display panel 200 has the same structure as the display panel 100 in terms of the materials and the manufacturing methods of a substrate 101, a bank 102, anodes 103, hole injection layers 104, hole transport layers 105, a red organic light-emitting layer 106R, a green organic light-emitting layer 106G, a blue organic light-emitting layer 106B, a first electron transport layer 107, a charge generation layer 108, a second blue organic light-emitting layer 109, a second electron transport layer 110, a cathode 111, a resin passivation layer 112, a first light conversion layer 113R, a second light conversion layer 113G, red color filters 114R, green color filters 114G, and a cover glass 115, and the structure, the size, and so on of respective parts in the red, green, and blue subpixel regions. Accordingly, explanation of these is omitted.

In the display panel 200, the anodes 3 are disposed on the substrate 101 spaced from each other. The bank 102 is disposed on the substrate 1, and has openings 102R, 102G, 102B, and 102DB that are provided so as to correspond in position to the red, green, blue, and dark blue subpixels, respectively. The structure of the inside of and part above the openings 102R and 102G is the same as that in the display panel 100. Within each opening 102B, the hole injection layer 104 and the organic light-emitting layer 106B are disposed. Within each opening 102DB, the hole injection layer 104 is disposed, and no organic light-emitting layer is disposed. The first electron transport layer 107, the charge generation layer 108, the second blue organic light-emitting layer 109, the second electron transport layer 110, the cathode 111, and the resin passivation layer 112 are sequentially disposed as solid films over the entire pixels so as to cover the red organic light-emitting layer 106R, the green organic light-emitting layer 106G, and the blue organic light-emitting layer 106B (hereinafter, referred to collectively as organic light-emitting layers 106 when no distinction is made therebetween) and the anode 103, which are disposed within the openings 102R, 102G, 102B, and 102DB, respectively, and extend over the openings 102R, 102G, 102B, and 102DB. Further, a blue color filter 114B is disposed above each opening 102DB defining the dark blue subpixel so as to extend over the blue and dark blue subpixels.

With this structure, blue light, which is emitted from part of the second blue organic light-emitting layer 109 in each dark blue subpixel region in within a corresponding opening 102DB, travels towards the blue color filter 114B which is disposed on the cover glass 115. Then, the blue light, which travels towards the blue color filter 114B, is output upwards the cover glass 115, as blue light with an increased color purity resulting from absorption of color components other than blue components by the blue color filter 114B.

Light emitted from the second blue organic light-emitting layer 109 is higher in terms of color purity than light emitted from the organic light-emitting layer 106B. For this reason, the color purity of light which travels towards the blue color filter 114B from the dark blue subpixels is originally high, and accordingly the color purity of blue light which is externally emitted from the dark blue subpixels is also high. As a result, according to the display panel 200, by synthesizing respective blue light emitted from the blue and dark blue subpixels, it is possible to not only exhibit the effects of the display panel 100 relating to Embodiment 1 but also improve the color purity of blue light emitted from the entire display panel. By controlling the dark blue subpixels and the blue subpixels, which are higher in terms of luminous efficiency than the dark blue subpixels to display images, it is possible to reduce the power consumption in the display panel. For example, an image in which the dark blue color is unnecessary is displayed by light emission from only the blue subpixels exhibiting a high luminous efficiency.

<Modification 3>

According to the display panel 200 relating to Embodiment 2, the blue color filter 114B is disposed above each opening 102DB defining the dark blue subpixel so as to extend over the blue and dark blue subpixels. Alternatively, the exemplified display panel 200 may include the blue color filter 114B that is disposed above only either each opening 102B defining the blue subpixel or each opening 102DB defining the dark blue subpixel. Further alternatively, the blue color filter 114B may not be disposed above the openings 102B and 102DB. This structure improves the luminous efficiency of the blue subpixels compared with the case where the blue color filter 114B is disposed above the blue and dark blue subpixels. As a result, it is possible to further reduce the power consumption in the display panel by controlling the blue and dark blue subpixels to display images.

<Modification 4>

Figure 15:
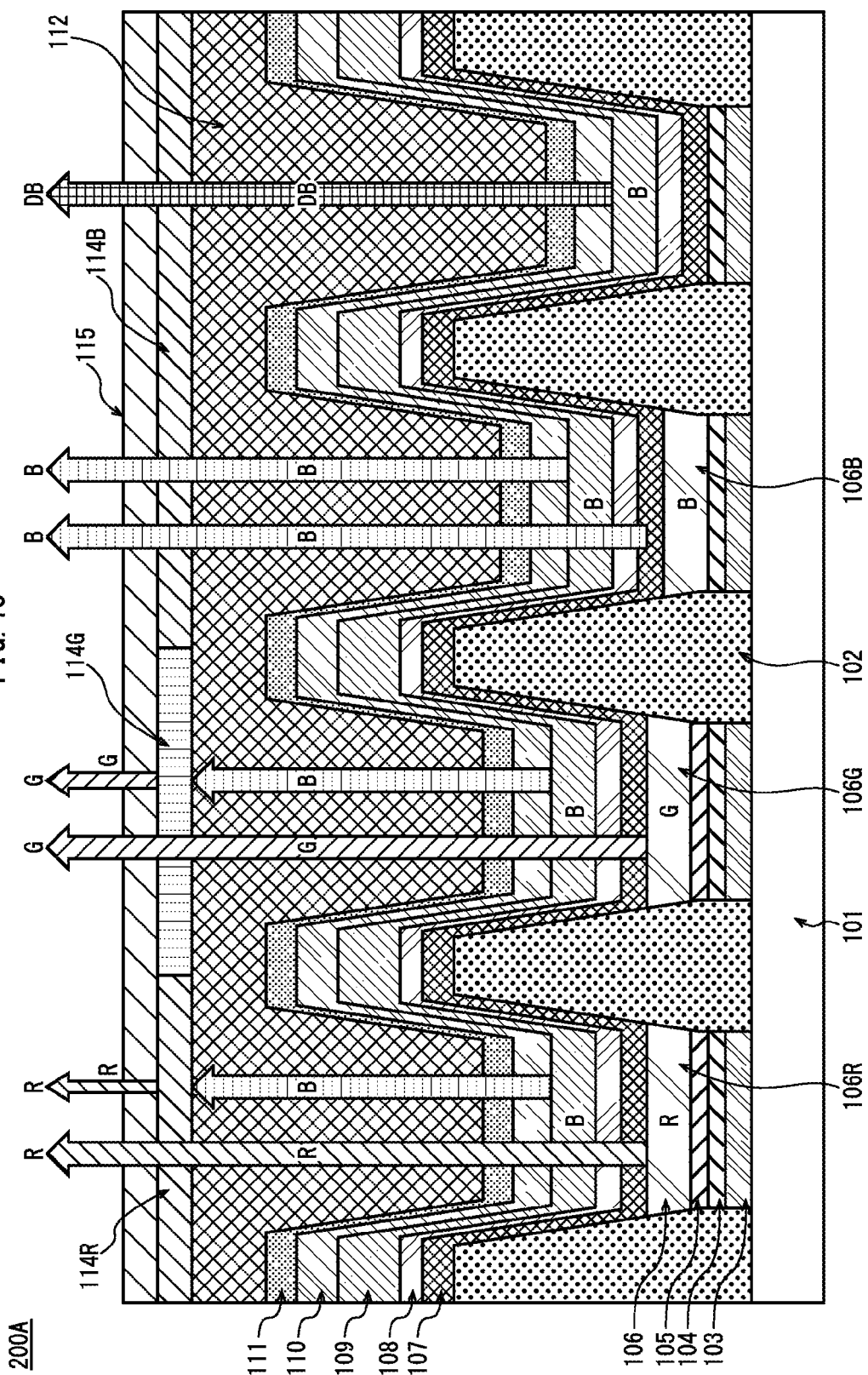
FIG. 15 is a cross-sectional view schematically showing the pixel structure in an organic EL display panel 200A relating to Modification 4.

Although the explanation has been given on the display panel 200 relating to Embodiment 2 and Modification 3, the exemplified display panel 200 and Modification 3 may be modified as explained below. FIG. 15 is a cross-sectional view schematically showing the pixel structure in an organic EL display panel 200A relating to Modification 4. As shown in FIG. 15, the organic EL display panel 200A (hereinafter, abbreviated as display panel 200A) has the same structure as the display panel 200 from which the first light conversion layer 113R and the second light conversion layer 113G are removed. With this structure, similarly to that in the display panel 100A, the red color filter 114R absorbs color components other than red components from blue light, which is emitted from part of the second blue organic light-emitting layer 109 in each red subpixel region, red light remaining after absorption is added to red light, which is emitted from the organic light-emitting layer 106R, and the light after addition is externally emitted. Similarly, the green color filter 114G absorbs color components other than green components from blue light, which is emitted from part of the second blue organic light-emitting layer in each green subpixel, green light remaining after the absorption is added to green light, which is emitted from the organic light-emitting layer 106R, and the light after addition is externally emitted.

As a result, it is possible to partially emit, as an output from the display panel 200A, respective blue light, which is emitted from the parts of the second blue organic light-emitting layer in the red and green subpixels, thereby improving the luminous efficiency.

<Other Modifications>

Although the explanation has been given on the display panels relating to the embodiments, the exemplified display panels may be modified as explained below. The present disclosure is of course not limited to the display panels exactly as explained in the above embodiments.

(1) The display panel 100 relating to Embodiment 1, the display panel 200 relating to Embodiment 2, and Modification 3 each include: the first filter that is disposed above the first light conversion layer in each red subpixel region, and blocks blue light emitted from the second blue organic light-emitting layer in the red subpixel region; and the second filter that is disposed above the second light conversion layer in each green subpixel region, and blocks blue light emitted from the second blue organic light-emitting layer in the green subpixel region.

However, the display panels 100 and 200 and Modification 3 only need to extract respective light from the parts of the second blue organic light-emitting layer in the red and green subpixel regions as well as light from the parts of the second blue organic light-emitting layer in the blue subpixel regions, and emit the light as an output from the display panel. The display panels 100 and 200 and Modification 3 may not include the first filter and the second filter. By increasing the color purity of light emitted from the first light conversion layer and the second light conversion layer, it is possible to ensure the color purity of light as an output from the display panel even if the first filter and the second filter are omitted.

(2) The display panel 100 relating to Embodiment 1, the display panel 100A relating to Modification 1, and the display panel 100B relating to Modification 2 include the red color filters 14R, the green color filters 14G, and the blue color filters 14B that are disposed so as to correspond in position to the red, green, and blue subpixels above the openings 2R, 2G, and 2B, respectively. However, the display panels 100, 100A, and 100B only need to absorb respective blue light emitted from the parts of the second blue organic light-emitting layer in the red and green subpixel regions and emit the blue light upwards the cover glass 15 as red light and green light with an increased color purity, and may not include the blue color filters 14B in the blue subpixel regions. In other words, the display panels 100, 100A, and 100B may include the red color filters 14R and the green color filters 14G that are disposed so as to correspond in position to the red and green subpixels above the openings 2R and 2G, respectively, and may not include the blue color filters 14B above the openings 2B. Even with this structure, it is possible to improve the luminance in the red and green subpixel regions to improve the luminous efficiency, and ensure the color purity of light as an output from the display panel.

(3) The display panel 100 relating to Embodiment 1 and the display panel 200 relating to Embodiment 2 include the first electron transport layer that is disposed between the entire red, green, and first blue organic light-emitting layers and the charge generation layer, and the second electron transport layer that is disposed between the cathode and the second blue organic light-emitting layer in the red, green, and blue subpixel regions.

However, the first and second electron transport layers do not necessarily need to be provided, and only one of or both of the first and second electron transport layers may not be provided in any or all of the red, green, and blue subpixel regions. Further, although the first and second electron transport layers are provided in the above Embodiments 1 and 2, the present disclosure is not limited by this structure, and an electron injection layer may be further provided in addition to the first and second electron transport layers.

(4) The display panel 100 relating to Embodiment 1 and the display panel 200 relating to Embodiment 2 include the first electron transport layer, the charge generation layer, the second blue organic light-emitting layer, the second electron transport layer, and the cathode, which are sequentially formed as solid films over the entire pixels so as to extend over the openings 2R, 2G, and 2B.

However, not all these films necessarily need to be formed as solid films over the entire pixels, and part or all of these films may be composed of portions that are discontinuous in the red, green, and blue subpixel regions.

Also in this case, the first electron transport layer, the charge generation layer, the second blue organic light-emitting layer, the second electron transport layer, and the cathode each collectively indicate the whole region including the discontinuous portions in the subpixels of the red, green, and blue colors and so on.

(5) In the above Embodiments 1 and 2, the anodes are provided on the side close to the substrate on which the TFTs are provided, and the cathode is provided on the side distant from the substrate. Alternatively, the cathode may be provided on the side close to the substrate on which the TFTs are provided, and the anodes may be provided on the side distant from the substrate.

<Supplement>

The embodiments described above each show a specific preferred example of the present disclosure. The numerical values, the shapes, the materials, the structural elements, the arrangement and connection status of the structural elements, the processes, the order of the processes, and so on described in the above embodiments are just examples, and do not intend to limit the present disclosure. Also, processes among the structural elements in the embodiments, which are not described in the independent claims representing the most generic concept of the present disclosure, are explained as arbitrary structural elements of a more preferred embodiment.

Also, the scale reduction of the structural elements shown in the figures in the above embodiments may differ from the actual scale reduction for easy understanding of the present disclosure. Further, the present disclosure is not limited by the description of the above embodiments, and may be appropriately modified without departing from the scope of the present disclosure.

Moreover, although the display panel and the display device include circuit components and members such as lead wires that are provided on the substrate, various types of aspects of the electrical wirings and the electric circuits may be implemented based on the common knowledge in the technical field, and explanation thereof is omitted because of not being directly relevant to the present disclosure. Note that the figures shown in the above embodiments are pattern diagrams, and accordingly the structural elements shown in the figures are not necessarily exactly scaled.

INDUSTRIAL APPLICABILITY

The organic EL display panel relating to the present disclosure is widely utilizable for organic light-emitting devices such as organic EL light-emitting devices and so on.

REFERENCE SIGNS LIST 1 substrate
2 barrier rib (bank)
3 pixel electrode (anode)
4 hole injection layer
5 hole transport layer
6 organic light-emitting layer
6B first blue organic light-emitting layer
6G green organic light-emitting layer
6R red organic light-emitting layer
7 first electron transport layer
8 charge generation layer
9 second blue organic light-emitting layer
10 second electron transport layer
11 counter electrode
12 resin passivation layer
13R first light conversion layer
13G second light conversion layer
14R red color filter
14G green color filter
14B blue color filter
15 cover glass
17 drive control unit
18-21 drive circuit
22 control circuit
100, 100A, 200, and 200A organic EL display panel
1000 display device

The invention claimed is:

1. An organic EL display panel that includes pixels each of which is composed of a red subpixel, a green subpixel, and a blue subpixel, the organic EL display panel comprising:
a substrate;
a barrier rib that is disposed on the substrate, and partitions between a red subpixel region, a green subpixel region, and a blue subpixel region of the respective red, green, and blue subpixels;
a first pixel electrode and a red organic light-emitting layer that are disposed above the substrate sequentially from a side of the substrate in the red subpixel region;
a second pixel electrode and a green organic light-emitting layer that are disposed above the substrate sequentially from the side of the substrate in the green subpixel region;
a third pixel electrode and a first blue organic light-emitting layer that are disposed above the substrate sequentially from the side of the substrate in the blue subpixel region;
a charge generation layer that is disposed above the red, green, and first blue organic light-emitting layers;
a second blue organic light-emitting layer that is disposed on the charge generation layer in the red, green, and blue subpixel regions;
a counter electrode of the first, second, and third pixel electrodes that is disposed above the second blue organic light-emitting layer in the red, green, and blue subpixels regions;
a first light conversion layer that is disposed above the second blue organic light-emitting layer in the red subpixel region, and converts blue light to red light; and
a second light conversion layer that is disposed above the second blue organic light-emitting layer in the green subpixel region, and converts blue light to green light.

2. The organic EL display panel of claim 1, wherein
the red, green, and first blue organic light-emitting layers have an organizational structure obtained by a wet process, and
the second blue organic light-emitting layer and the charge generation layer have an organizational structure obtained by a dry process.

3. The organic EL display panel of claim 1, further comprising:
a first filter that is disposed on the first light conversion layer in the red subpixel region, and blocks blue light; and
a second filter that is disposed on the second light conversion layer in the green subpixel region, and blocks blue light.

4. The organic EL display panel of claim 1, further comprising
a third light conversion layer that is disposed above the counter electrode in the blue subpixel region, and converts blue light that is emitted from at least one of the first and second blue organic light-emitting layers in the blue subpixel region to blue light having a different luminescence spectrum from the emitted blue light.

5. The organic EL display panel of claim 1, further comprising
a third filter that is disposed above the counter electrode in the blue subpixel region, and partially blocks blue light that is emitted from at least one of the first and second blue organic light-emitting layers in the blue subpixel region.

6. The organic EL display panel of claim 1, further comprising:
a third light conversion layer that is disposed above the counter electrode in the blue subpixel region, and converts blue light that is emitted from at least one of the first and second blue organic light-emitting layers in the blue subpixel region to blue light having a different luminescence spectrum from the emitted blue light; and
a third filter that is disposed on the third light conversion layer, and partially blocks the blue light that is emitted upwards from the third light conversion layer.

7. The organic EL display panel of claim 1, further comprising:
a first electron transport layer that is disposed between the entire red, green, and first blue organic light-emitting layers and the charge generation layer; and
a second electron transport layer that is disposed between the second blue organic light-emitting layer and the counter electrode in the red, green, and blue subpixel regions, wherein
the second electron transport layer has a larger thickness than the first electron transport layer.

8. The organic EL display panel of claim 1, wherein
the charge generation layer supplies holes to the second blue organic light-emitting layer, and supplies electrons from at least one of respective parts of the red, green, and blue subpixel regions to a corresponding one of the red, green, and first blue organic light-emitting layers in the red, green, and blue subpixel regions, respectively.

9. The organic EL display panel of claim 1, wherein the charge generation layer is discontinuous above the red, green, and first blue organic light-emitting layers.

10. The organic EL display panel of claim 1, wherein the second blue organic light-emitting layer is discontinuous in the red, green, and blue subpixel regions.

11. An organic EL display panel that includes pixels each of which is composed of a red subpixel, a green subpixel, and a blue subpixel, the organic EL display panel comprising:
   a substrate;
   a barrier rib that is disposed on the substrate, and partitions between a red subpixel region, a green subpixel region, and a blue subpixel region of the respective red, green, and blue subpixels;
   a first pixel electrode and a red organic light-emitting layer that are disposed above the substrate sequentially from a side of the substrate in the red subpixel region;
   a second pixel electrode and a green organic light-emitting layer that are disposed above the substrate sequentially from the side of the substrate in the green subpixel region;
   a third pixel electrode and a first blue organic light-emitting layer that are disposed above the substrate sequentially from the side of the substrate in the blue subpixel region;
   a charge generation layer that is disposed above the red, green, and first blue organic light-emitting layers;
   a second blue organic light-emitting layer that is disposed on the charge generation layer in the red, green, and blue subpixel regions;
   a counter electrode of the first, second, and third pixel electrodes that is disposed above the second blue organic light-emitting layer in the red, green, and blue subpixels regions;
   a first filter that is disposed above the second blue organic light-emitting layer in the red subpixel region, and blocks blue light; and
   a second filter that is disposed above the second blue organic light-emitting layer in the green subpixel region, and blocks blue light.

12. The organic EL display panel of claim 11, further comprising
   a third filter that is disposed above the counter electrode in the blue subpixel region, and partially blocks blue light that is emitted from at least one of the first and second blue organic light-emitting layers in the blue subpixel region.

13. A manufacturing method of the organic EL display panel of claim 1, the manufacturing method comprising the steps of:
   forming each of the first, second, third pixel electrodes, the red, green, and first blue organic light-emitting layers by a wet process; and
   forming each of the charge generation layer, the second blue organic light-emitting layer, and the counter electrode by a dry process.

14. The manufacturing method of claim 13, wherein the wet process is one or more of a printing method, a spin coating method, an inkjet method, and a photolithography method, and
   the dry process is one or more of a vapor deposition method, a sputtering method, and an ion plating method.

15. The organic EL display panel of claim 1, wherein the first and second light conversion layers contain a fluorescent colorant which absorbs light emitted from the second blue organic light-emitting layer and which performs wavelength conversion on the light.

16. The organic EL display panel of claim 1, wherein the first and second light conversion layers include a wavelength converter which converts 30% to 90% of the blue light to red light and green light, respectively.

* * * * *